United States Patent [19]
Webster et al.

[11] Patent Number: 5,500,879
[45] Date of Patent: Mar. 19, 1996

[54] BLIND SIGNAL SEPARATION AND EQUALIZATION OF FULL-DUPLEX AMPLITUDE MODULATED SIGNALS ON A SIGNAL TRANSMISSION LINE

[75] Inventors: Mark A. Webster, Palm Bay; Keith R. Baldwin, Melbourne Beach; Richard D. Roberts, Palm Bay, all of Fla.

[73] Assignee: Adtran, Huntsville, Ala.

[21] Appl. No.: 213,886

[22] Filed: Mar. 16, 1994

Related U.S. Application Data

[63] Continuation-in-part of Ser. No. 969,788, Oct. 29, 1992, abandoned, which is a continuation-in-part of Ser. No. 930,728, Aug. 14, 1992, Pat. No. 5,425,042.

[51] Int. Cl.$^6$ ........................................ H03K 7/02
[52] U.S. Cl. ........................ 375/353; 375/257; 375/350
[58] Field of Search ............................. 375/232–233, 375/257, 288, 240, 350; 333/353, 17.3, 109, 112, 115; 332/115; 364/724.19

[56] References Cited

U.S. PATENT DOCUMENTS

| | | | |
|---|---|---|---|
| 3,828,281 | 8/1974 | Chambers, Jr. | 333/17.3 |
| 3,934,213 | 1/1976 | Stuckert | 333/112 |
| 4,034,289 | 7/1977 | Rozylowicz et al. | 333/115 |

*Primary Examiner*—Young T. Tse
*Attorney, Agent, or Firm*—Charles Wands

[57] ABSTRACT

An apparatus for blind signal separation and equalization of PAM signals on a full duplex transmission line is capable of successfully extracting and recovering the respective signalling components of a full-duplex wireline digital data link without having to disturb the link during its use (e.g. as by interrupting service to sever the link in order to install a line coupling device, such as a modem or attenuator pad to signal monitoring equipment) and without having to generate PN or other training sequences. A full-duplex wireline bridge device comprises a signal characteristic monitoring device that is capable of monitoring the link and providing respective output signals representative of the respective unidirectional signal components being transmitted simultaneously in opposite directions along the link. A directional signal separator, comprised of a voltage probe and a current probe, each of which can be coupled to the link without severing the link or otherwise disrupting ongoing communications, couples the signal characteristic monitoring device to the link. The signal processing device is operative to controllably combine the outputs of the voltage and current probes and provides respective output signals that are representative of the desired unidirectional signal components. The communications link may be either a single wire transmission line or a two wire balanced transmission line. In the latter instance individual probes of pairs of voltage and current probes are coupled to respective portions of the two wire balanced transmission line.

10 Claims, 16 Drawing Sheets

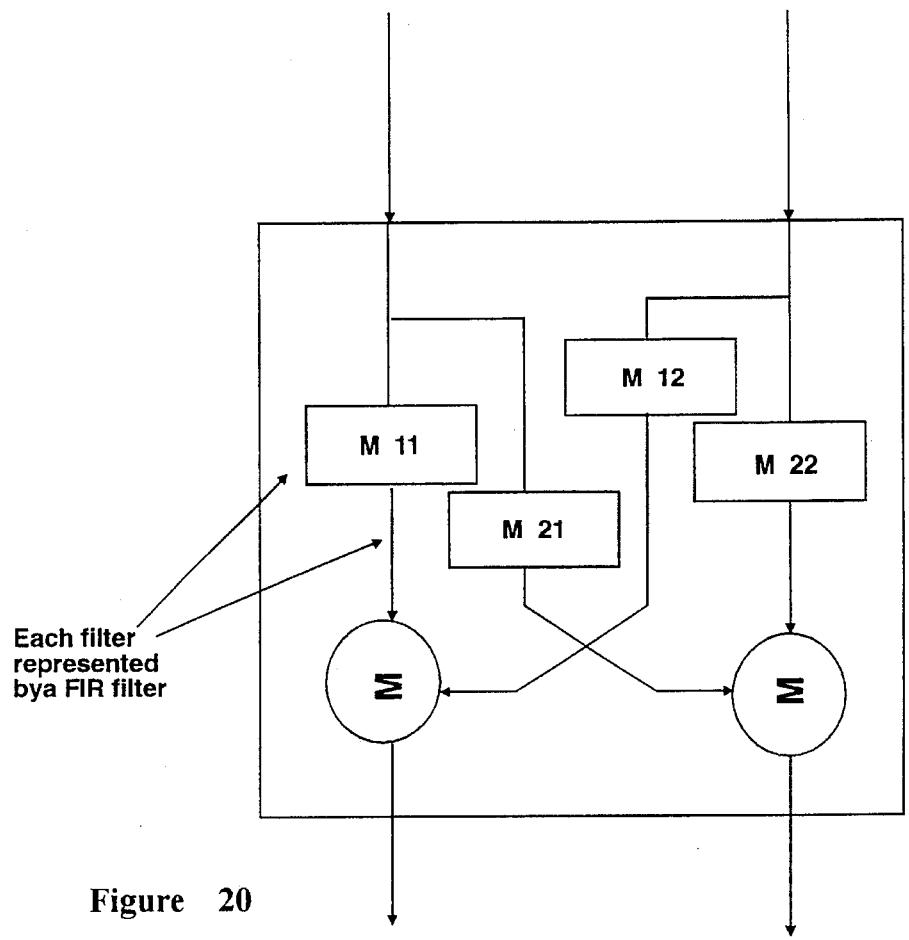
Figure 20
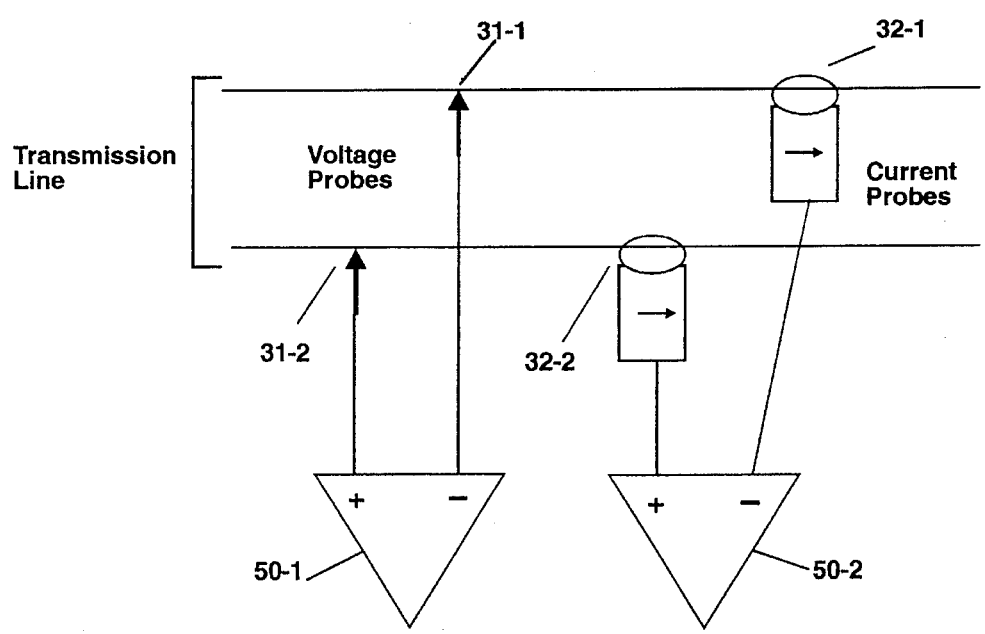
Figure 21  Voltage Sample   Current Sample
To Signal Processing

BLIND SIGNAL SEPARATION AND EQUALIZATION OF FULL-DUPLEX AMPLITUDE MODULATED SIGNALS ON A SIGNAL TRANSMISSION LINE

CROSS REFERENCE TO RELATED APPLICATIONS

This is a continuation-in-part application of patent application Ser. No. 07/969,788, filed Oct. 29, 1992, now abandoned, which, in turn, is a continuation-in-part of application Ser. No. 07/930,728, filed Aug. 14, 1992, now U.S. Pat. No. 5,425,042.

FIELD OF THE INVENTION

The present invention relates to communication systems and is particularly directed to a wireline monitoring device and an associated signal processing mechanism that is capable of successfully extracting and recovering the respective signalling components of a full-duplex wireline digital data link.

BACKGROUND OF THE INVENTION

Full-duplex communication links, a diagrammatic illustration of an individual one of which is shown in FIG. 1, are commonly employed in a wide variety of communication systems. In a digital communication system the format of the signal being conveyed over the link is typically an analog waveform the level of which conveys digital logic level information to the link users in some methodical manner. On occasion, as in the case of a routine maintenance operation, it may be necessary to couple signal measuring equipment to the link. If, for example, a signal monitoring device, such as an oscilloscope, is coupled to link 13 while only user A is transmitting, then the data waveform for user A would be observed on the scope display screen. Likewise, if only user B was transmitting, then the observed waveform would be that belonging to user B.

Because a full-duplex data link is one in which dual direction digital communications take place simultaneously between a user A at a 'west' station 11 and a user B at an 'east' station 12 at the opposite end of a link 13, then whatever device is used to monitor the signals must be able to both intercept the two signals and separate them from one another. Once the two signals are separated, they can be processed (via a demodulator) to recover the digital information conveyed from user A and/or user B.

Operationally, each user is able to recover the other's data through waveform separation resulting from an a priori knowledge of the transmitted waveform. Techniques used to accomplish this include transformer hybrids and digital echo cancellation. (It is assumed that the demodulators contain the necessary signal processing hardware and employ appropriate signal processing techniques to compensate for any distortion present in the separated signals due to the two wire transmission line.) In the case of merely coupling an oscilloscope to the link, when both user A and B are transmitting, the observed waveform on the link is the composite waveform for A and B, so that the two signals interfere with each other in such a manner that, in general, it is not possible to distinguish the signal transmitted from either user A or user B.

Historically, this inability to distinguish between the two signals has involved the insertion of some form of device directly into the link, as diagrammatically illustrated in FIG. 2. Unfortunately, such an installation first requires that the line be cut and that termination devices, such as respective type A and type B modems 21 and 22 diagrammatically illustrated in FIG. 3, be physically installed, thereby disrupting the ongoing communications between users A and B. Moreover, a power failure in such cascaded back-to-back modem equipment would interrupt 5 link service.

Another technique comprises establishing an amplitude difference between the two signals Sa and Sb, by installing an attenuator in the line and measuring the amplitude of the signal on one side of the attenuator versus the signal level on the other side of the attenuator. Using this signal level information, user A's signal can be separated from user B's signal. Again, however, this scheme requires cutting the wire and installing the attenuator. Moreover, the permanent insertion of the attenuator imparts an addition loss that can degrade communications between users A and B.

A further approach involves sampling the wireline signals at two spaced apart locations along the link in order to establish a phase or amplitude difference between the sampled signals and thereby differentiate between signals Sa and Sb.

However, due to the speed of propagation of the electrical signals on the link with respect to the data rate of the digital data, the separation distance between the two different tap points would have to be hundreds of feet, so that such a technique is not a practical solution to the problem.

SUMMARY OF THE INVENTION

In accordance with the present invention the above-numerated drawbacks of conventional link monitoring techniques are effectively obviated by means of a wireline bridge tap device and an associated signal processing mechanism that is capable of successfully extracting and recovering the respective signalling components of a full-duplex wireline digital data link without having to disturb the link during its use (e.g. as by interrupting service to sever the link in order to install a line coupling device, such as a modem or attenuator pad to signal monitoring equipment).

The full-duplex wireline bridge device of the invention comprises a signal characteristic monitoring device that is capable of monitoring the link and providing respective output signals representative of the respective unidirectional signal components being transmitted simultaneously in opposite directions along the link. A directional signal separator, comprised of a voltage probe and a current probe, each of which can be coupled to the link without severing the link or otherwise disrupting ongoing communications, couples the signal characteristic monitoring device to the link. The signal processing device is operative to controllably combine the outputs of the voltage and current probes and provides respective output signals that are representative of the desired unidirectional signal components.

The communications link may be either a single wire transmission line or a two wire balanced transmission line. In the latter instance individual probes of pairs of voltage and current probes are coupled to respective portions of the two wire balanced transmission line. A first differential amplifier is coupled to the outputs of the voltage probes and a second differential amplifier is coupled to the outputs of the current probes. The differential amplifiers extract the differential mode signal and reject the common mode signal.

The signal characteristic monitoring device employs a signal processing mechanism which adjusts the characteristic impedance of the interface so as to compensate for the impedance characteristics of the communication link. It also provides compensation for prescribed performance characteristics of the directional signal separator.

According to an exemplary embodiment of the present invention, an apparatus for blind signal separation and equalization of full duplex pulse amplitude modulated (PAM) signals on a signal transmission line detects the stronger of the PAM signals, provides a signal corresponding to the difference between the line signal and the contribution of the stronger PAM signal to the line signal, and provides a weak PAM signal by filtering the distortion out of the difference between the line signal and the contribution of the strong PAM signal on the line signal. The present invention employs: analog and digital processing to separate the stronger PAM signal and the weaker PAM signal from the line signal. The stronger PAM signal is ascertained by estimating the impedance experienced by the weaker PAM signal, multiplying the line current by the estimated impedance to estimate the weaker PAM signal, and subtracting the estimated weaker PAM signal from the line signal to provide the stronger PAM signal. The weaker PAM signal is subsequently ascertained by estimating the contribution of the stronger PAM signal on the overall line signal, subtracting the estimate from the overall line signal to provide the weaker PAM signal and filtering line distortion out of the result. In an exemplary embodiment of the invention, a first order approximation of the weaker PAM signal is provided by either adding or subtracting the current signal to or from the line voltage signal.

According further to the present invention, an apparatus for blind signal separation and equalization of full duplex pulse amplitude modulated (PAM) signals on a signal transmission line employs a physical interface unit for sensing the magnitudes of a transmission line voltage signal and of a transmission line current signal, an analog processing unit having an analog signal conditioner, A/D converters for converting the line voltage signal, the line current signal, and the first order approximation of the weaker PAM signal into digital values, a first filter for approximating impedance experienced by the weaker PAM signal having an input coupled to the digital output of the analog conditioning unit indicative of line current, a first summer coupled to the analog conditioning unit and the first filter for providing a signal indicative of the digital line voltage and the output of the first filter, a second filter coupled to the output of the first summer for providing the stronger of the PAM signals, a third filter coupled to the output of the second filter for approximating a signal indicative of the contribution of the stronger of the PAM signals to the line signal, a second summer coupled to the first order approximation of the weaker PAM signal and coupled to the output of the third filter for subtracting the output of the third filter from the first order approximation of the weaker of the PAM signals, and a fourth filter coupled to the output of the second summer for providing the weaker of the PAM signals. According to an exemplary embodiment of the present invention, the filters may be implemented by adaptive digital filters.

A feature of the present invention is that the signals on the transmission line can be separated and accessed without disrupting communication by developing PN sequence or other training sequence data. The filters are initialized during normal communication using normal communication data.

BRIEF DESCRIPTION OF THE DRAWINGS

FIG. 20 diagrammatically illustrates a time domain M(k) matrix representation of channel distortion; and FIG. 21 diagrammatically illustrates an embodiment of a two-wire implementation of the present invention;

DETAILED DESCRIPTION

Figure 1:
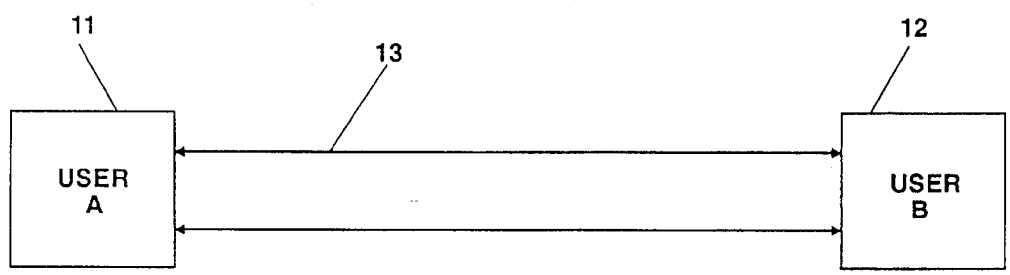
FIG. 1 is a diagrammatic illustration of full-duplex communication link.
Figure 2:
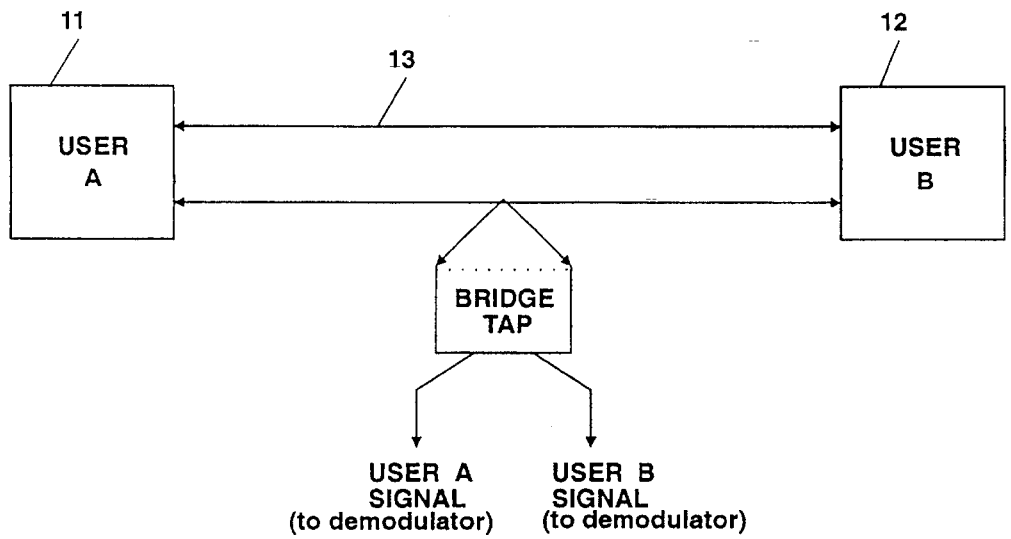
FIG. 2 diagrammatically illustrates the installation of a bridge tap into a communication link for intercepting bidirectional signals being transmitted over the link.
Figure 3:
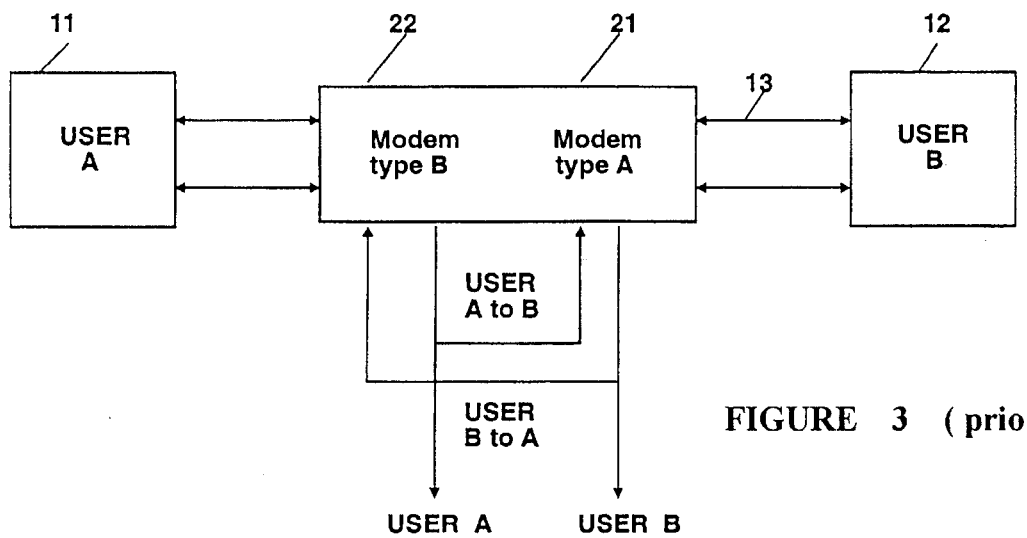
FIG. 3 diagrammatically illustrates the installation of modem devices for intercepting bidirectional signals transmitted over the link.
Figure 4:
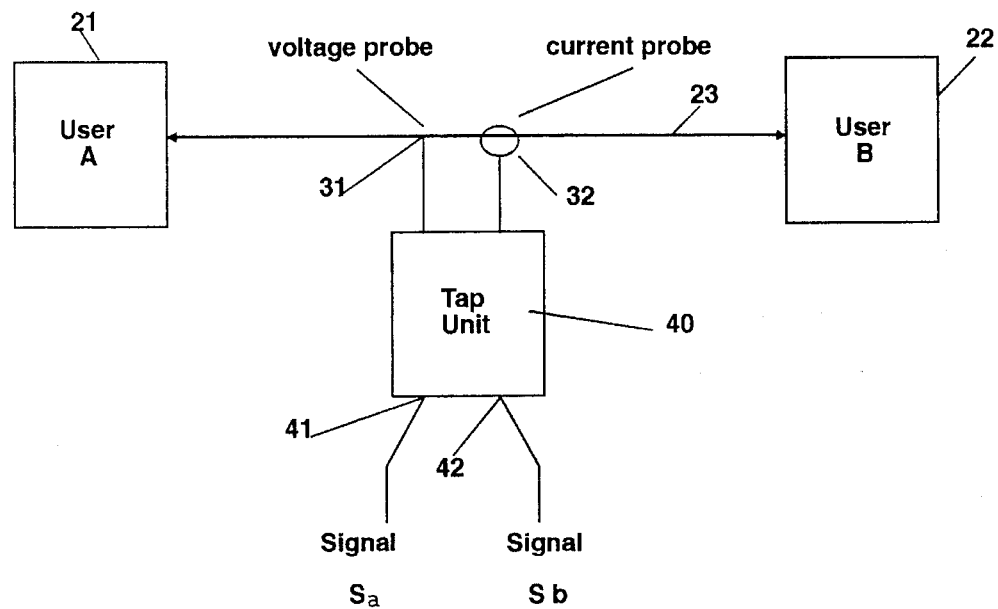
FIG. 4 diagrammatically illustrates a full-duplex digital communication link for effecting digital communications simultaneously between a user A at a 'west' station and a user B at an 'east' station, with a complementary sensor probe pair for sensing respective voltage and current components of signals carried on the link.

FIG. 4 diagrammatically illustrates a full-duplex digital communication link 23 for effecting digital communications simultaneously between a user A at a 'west' station 21 and a user B at an 'east' station 22, with a complementary sensor device pair 31, 32 for sensing respective voltage and current characteristics of the line coupled to a signal processing unit 40, from output ports 41, 42 of which respective signals Sa and Sb are derived. It is initially assumed that communication link 23 is an ideal transmission line with a constant impedance and infinite bandwidth. It is also be assumed that each of voltage probe 31 and current probe 32 is ideal. That is, voltage probe 31 has infinite bandwidth and infinite input impedance. Likewise current probe 32 has infinite bandwidth and is linearly responsive to the presence of any current flowing in the line. It is also assumed that link 23 is a single wire; subsequent description will address the case of a two wire communications link.

Figure 5:
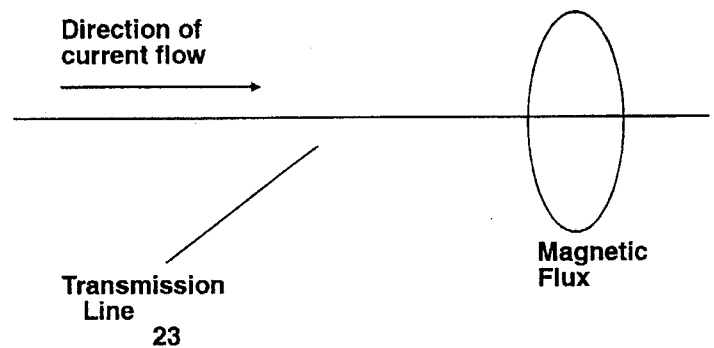
FIG. 5 diagrammatically illustrates the application of the right hand rule for a magnetic field surrounding the wire of a communication link.

Because any current flow in the transmission line gives rise to a magnetic field surrounding the wire expressed as the magnetic flux density, monitoring the current flowing through the transmission line wire gives an indication as to which direction the current is propagating through the line, with the direction of the flux at any point about the wire, diagrammatically shown in FIG. 5. This direction of the magnetic flux is important because reversing the flow of current in the wire reverses the direction of the flux. Thus, it is only necessary to monitor the direction of the flux to determine in which direction the current is flowing.

The total magnetic flux passing through any surface surrounding the wire—specifically a torroidal coil of wire employed by a commercially available 'clip-on' current probe sensor—gives rise to an induced voltage. For a coil of wire, the induced voltage V is given by:

$$V = -L \frac{dI}{dt}$$

where L is the induction of the coil of wire surrounding the transmission line and I is the current flowing in the transmission line. It will be observed that if the relative current flow in the transmission line wire reverses direction then the polarity of V reverses sign.

Figure 6:
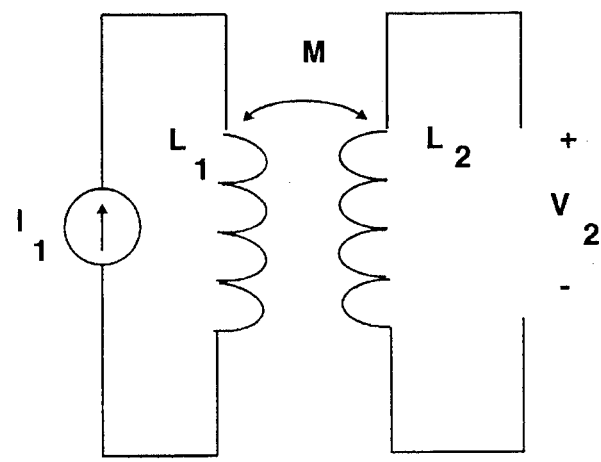
FIG. 6 is an equivalent circuit diagram of a clip-on coil of a commercially available current probe.

The clip-on coil of a commercially available current probe may be modeled by a transformer, an equivalent circuit diagram of which is shown in FIG. 6. The coil/transformer has a mutual inductance M which is the inductance that represents the mutual effect of two coils L1, L2 that share the same magnetic flux field.

The voltage $V_2 = M dI_1/dt$ represents the contribution of current probe 32 to the directional coupler operation. The coefficient of coupling K represents both how efficiently the magnetic flux is coupling between the two coils L1 and L2 and how efficiently the current probe is "picking up" the magnetic flux emanating about the transmission line wire. For K=1, all the flux generated by L1 passes through L2; for K=0, none of the flux generated by L1 passes through L2.

K typically has a value greater than 0.9 for high quality transformers and in general may be expressed as $$K = \frac{M}{\sqrt{(L_1 L_2)}}$$

Although K will not be used explicitly in the following discussion, it can be shown that for K less than 1.0 the response characteristic of the transformer (current probe 32) will have a frequency dependency. That is, the frequency response of the current probe is not flat, so that compensation is required, as will be described.

Figure 7:
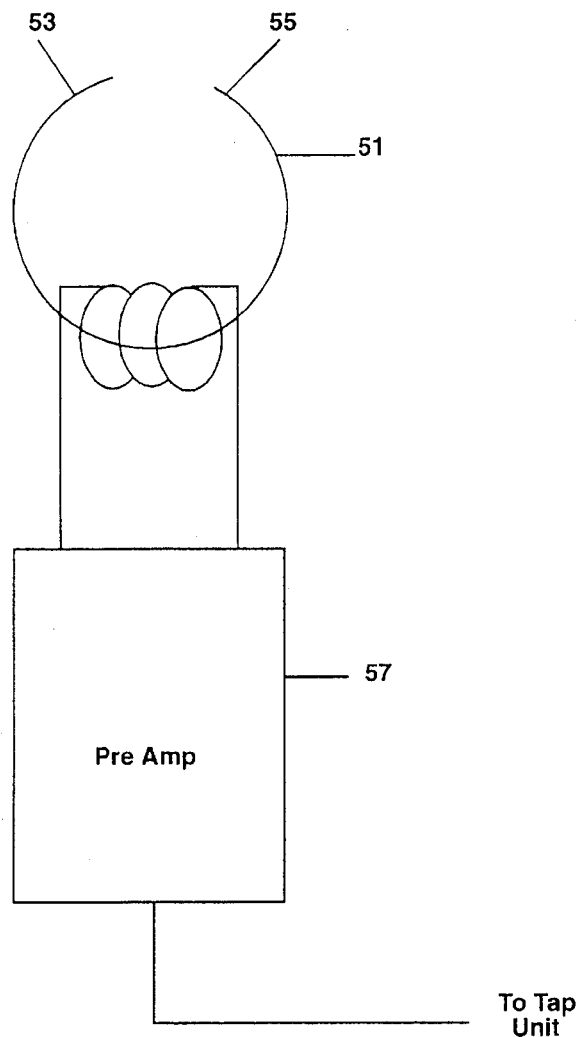
FIG. 7 diagrammatically illustrates a torroidal pickup coil of a commercially available current probe.

As illustrated in FIG. 7, the torroidal pickup coil 51 of a commercially available current probe is typically hinged with jaws 53, 55 that open and clamp around the wire to be sensed. The jaws then snap close around the wire without physically penetrating it. Often there is a "pre-amplifier" unit 57 that is associated with the probe and is considered to be part of the current probe device. Voltage probe 31 is preferably a commercially available, high impedance, wide bandwidth oscilloscope probe, which commonly contains a spring loaded hook device at its distal end to make a mechanical connection to a metallic conductor. While this means that a portion of the insulation on the transmission link wire will have to be removed, the wire does not have to be physically cut. Since the probe contains a small amount of internal shunt capacitance, it also exhibits a frequency dependency in its response. As the frequency increases, this shunt capacitance causes the upper frequency response to have more loss than the lower frequency response.

Again, as will be described, this non-flat frequency response must be compensated to achieve proper operation of the directional coupler and hence the tap on the transmission line.

With voltage probe 31 clipped on the transmission wire (e.g. zero ohmic contact) and current probe 32 is clipped around the transmission line, the complementary probe device of FIG. 4 provides both a sample of the voltage present on the line and a sample of the current flowing through the line. As will be described, by the proper combination of these voltage and current samples we can separate the two signals Sa and Sb from users A and B. The signals may be expressed as:

Signal $Sa = Gv*V\text{sample} + Gc*I\text{sample}$

Signal $Sb = Gv*V\text{sample} - Gc*I\text{sample}$ where:
Vsample is the voltage sample value,
Gv is a voltage sample gain scaler,
Isample is the current sample value, and
Gc is a current sample gain scaler.

It should be noted that the only difference between the required condition to recover signal Sa instead of signal Sb is a sign reversal in the equations. Circuits which are capable of performing this functionality, namely, are responsive to what direction a signal is propagating, fall under the general category "directional couplers." Placing a directional coupler in an ideal transmission line carrying a full-duplex communications link will allow the recovery of only one of the two signals. By modifying the connections within the directional coupler, the second signal, which is propagating in the opposite direction, may be recovered. To allow both signals to be recovered at the same time, a bi-directional coupler may be employed.

The functionality and mathematical expressions of directional couplers are well known. Examples of conventional directional couplers using coupled transmission lines and/or coupled magnetic circuits (transformers) are described in U.S. Pat. No. 3,426,298, entitled "Broadband Directional Coupler," and in articles by McDonald, entitled "Low Cost, Wide Band Dual Directional Coupler", RF Design, May/June, 1982, and McWhorter, entitled "Broadband RF Transformer Directional Couplers," RF Design, July 1991. None of these conventional implementations employs the combination of a voltage probe and a current probe to effectively perform the functionality of a directional coupler.

Figure 8:
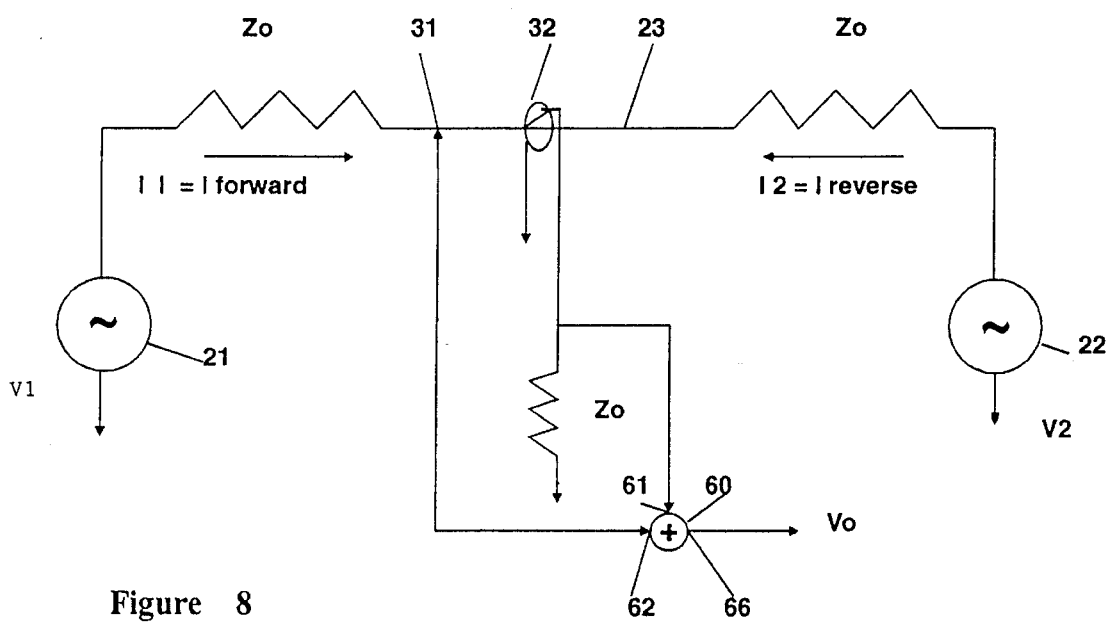
FIG. 8 is a schematic of a directional coupler formed by the interconnection of a current probe and a voltage probe.

FIG. 8 is a schematic of a directional coupler formed by the interconnection of a current probe and a voltage probe. An expression for a directional coupler, assuming an ideal transmission line of characteristic impedance Z0, comprised of voltage and current probes may be derived. (As noted above, a directional coupler is a device that responds to a signal propagating only in one preferred direction.)

The ideal transmission line itself is considered to contain impedances Z0 between the respective west and east ends 11 and 12 of the link and the location whereat the voltage probe 31 and current probe 32 are coupled to the line. Current probe 32 is terminated to ground through the design impedance Z0 of the current probe when performing the directional coupler function and is coupled to one input 61 of a summing circuit 60. Voltage probe 31 is coupled to a second input 62 of summing circuit 60.

The signals of interest in the directional coupler connection of FIG. 8 are Forward=V1/2, forward=V1/(2Z0), Reverse=V2/2, and reverse=V2/(2Z0). The voltage VT and the current IT at the tap point may be defined as VT=Forward+ Reverse, and IT=forward−reverse. The directional coupler operates on the quantities VT and IT to separate the forward and reverse propagating waves. The output voltage Vo is given by:

$Vo = VT + (B)(IT)(Z0) = V1(1+B)/2 + V2(1-B)/2$

It can readily be seen that for B=+1, Vo=V1, and for B=−1, Vo=V2. As a consequence, the directional coupler is able to separate the forward and reverse propagating waves. Since the transmission line is assumed to be ideal, it also separates the signal sources on each end of the line. Since the transmission line impedance is assumed to be constant regardless of frequency, the signal sources V1 and V2 are representative of time domain transforms (i.e. digital data information) while being perfectly separated at Vo.

Although the foregoing demonstrates that under ideal conditions a directional coupler can perfectly separate a forward propagating waveform emitting from a source Sa from a reverse propagating waveform emitting from the source Sb. This separation between the sources occurred because the transmission line is ideal. Namely, the line impedance is constant with frequency; hence, the line has no signal reflections on it due to any impedance anomaly.

Figure 9:
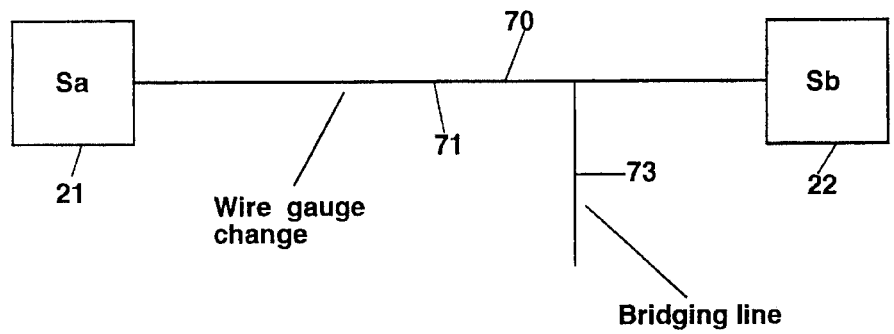
FIG. 9 diagrammatically illustrates an example of a typical wireline transmission line between two sources, having a change in wire gauge and a bridging line which are anomalies causing the characteristic impedance of the transmission line between the sources to be non-constant.

Unfortunately, in a real installation, transmission lines for a wireline data communications link often do not have constant characteristic impedance due to changes in wire gauge, bridging lines, etc. FIG. 9 diagrammatically illustrates an example of a typical wireline transmission line 70 between a source Sa and a source Sb, having a change in wire gauge 71 and a bridging line 73, which are anomalies causing the characteristic impedance of the transmission line 70 between source Sa and source Sb to be non-constant.

Figure 10:
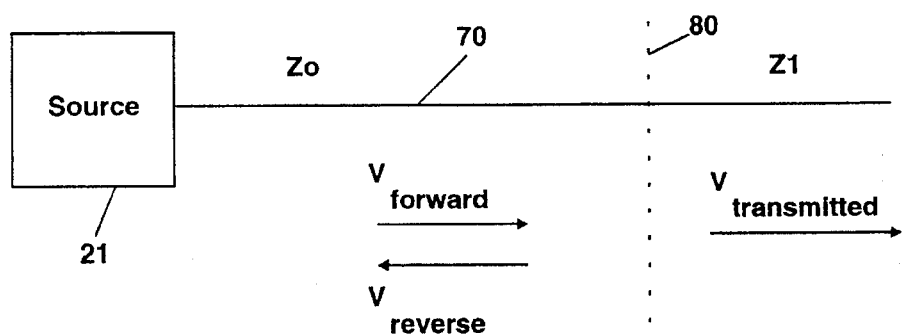
FIG. 10 diagrammatically illustrates an impedance transition at reflection boundary.

It is well known that when a transmission line is not terminated in its characteristic impedance that part of the forward propagating electromagnetic wave is reflected backwards from the impedance transition diagrammatically illustrated at reflection boundary 80 in FIG. 10. The amount of reflection is characterized by the reflection coefficient which may be expressed as:

$P_1 = (Zl - Zo)/(Zl + Zo)$.

Figure 11:
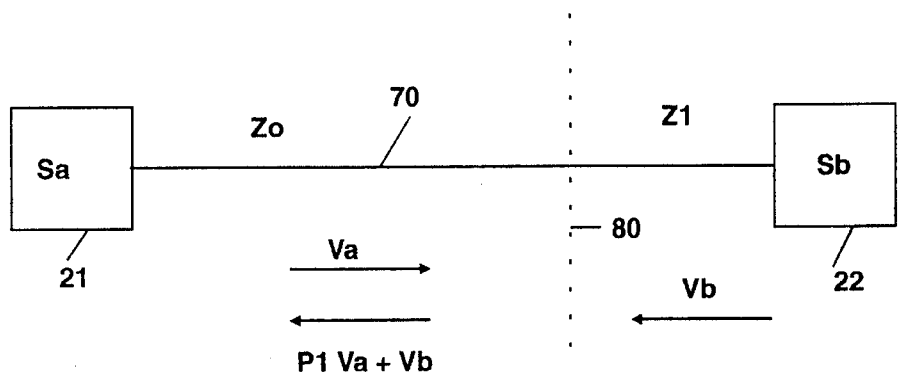
FIG. 11 shows a transmission line for a typical wireline communications link that contains a multitude of impedance anomalies that cause the signals from sources Sa and Sb to appear as additive terms in the forward and reverse propagating waves.

An actual transmission line for a typical wireline communications link contains a multitude of impedance anomalies that cause the signals from sources Sa and Sb to appear as additive terms in the forward and reverse propagating waves. This phenomenon is illustrated in FIG. 11, from which it can be seen that the reverse propagating wave may be expressed as:

$V\text{reverse} = P_1 Va + Vb$.

Thus, it can be seen that the signals from sources Sa and Sb are intrinsically mixed together.

If a directional coupler with a terminating impedance of Zo is located anywhere along the transmission line of characteristic impedance Zo, the forward and reverse propagating waves may be separated from one another. However, as demonstrated above, signals from sources Sa and Sb are not separated as desired. In order to separate these signals it is necessary to change the terminating impedance of the coupler, to form what may be termed a directional signal separator. Unlike a directional coupler, which can only separate the forward and reverse propagating waves, a directional signal separator compensates for the impedance anomalies of the transmission line and effectively separates the signals from sources Sa and Sb.

Figure 12:
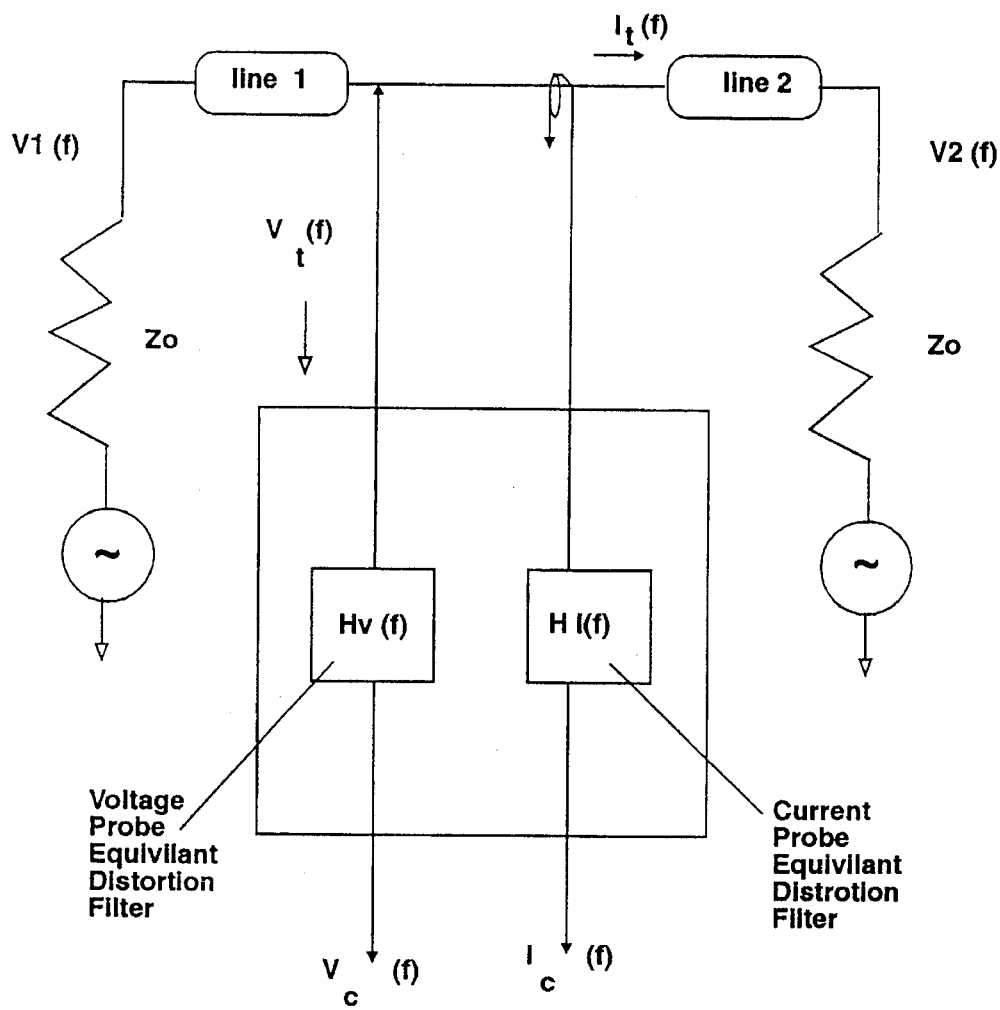
FIG. 12 diagrammatically illustrates a directional coupler circuit model which includes transmission lines together with the distortion of the lines.

More particularly, consider a directional coupler circuit operating at one frequency within a frequency band of interest, which may typically extend from near D.C. up to several hundred kilohertz. The upper frequency limit may be delineated as F sub-upper. FIG. 12 diagrammatically illustrates a directional coupler circuit model which includes transmission lines together with the distortion of the lines. The distortion due to the voltage and current probes is modelled as distortion filters.

Figure 13:
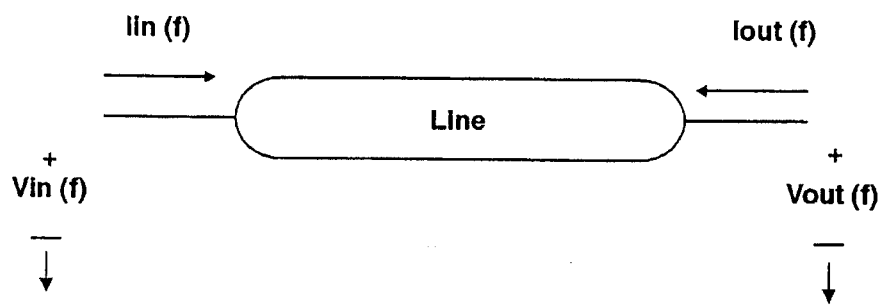
FIG. 13 shows a voltage and current transfer function for circuit model of the effects of the transmission lines.

Within the circuit model the effects of the transmission lines may be defined using the voltage and current transfer function illustrated in FIG. 13 and employing the ABCD matrix representation $$\begin{bmatrix} Vin(f) \\ Iin(f) \end{bmatrix} = \begin{bmatrix} A & B \\ C & D \end{bmatrix} \begin{bmatrix} Vout(f) \\ -Iout(f) \end{bmatrix}$$

Figure 14:
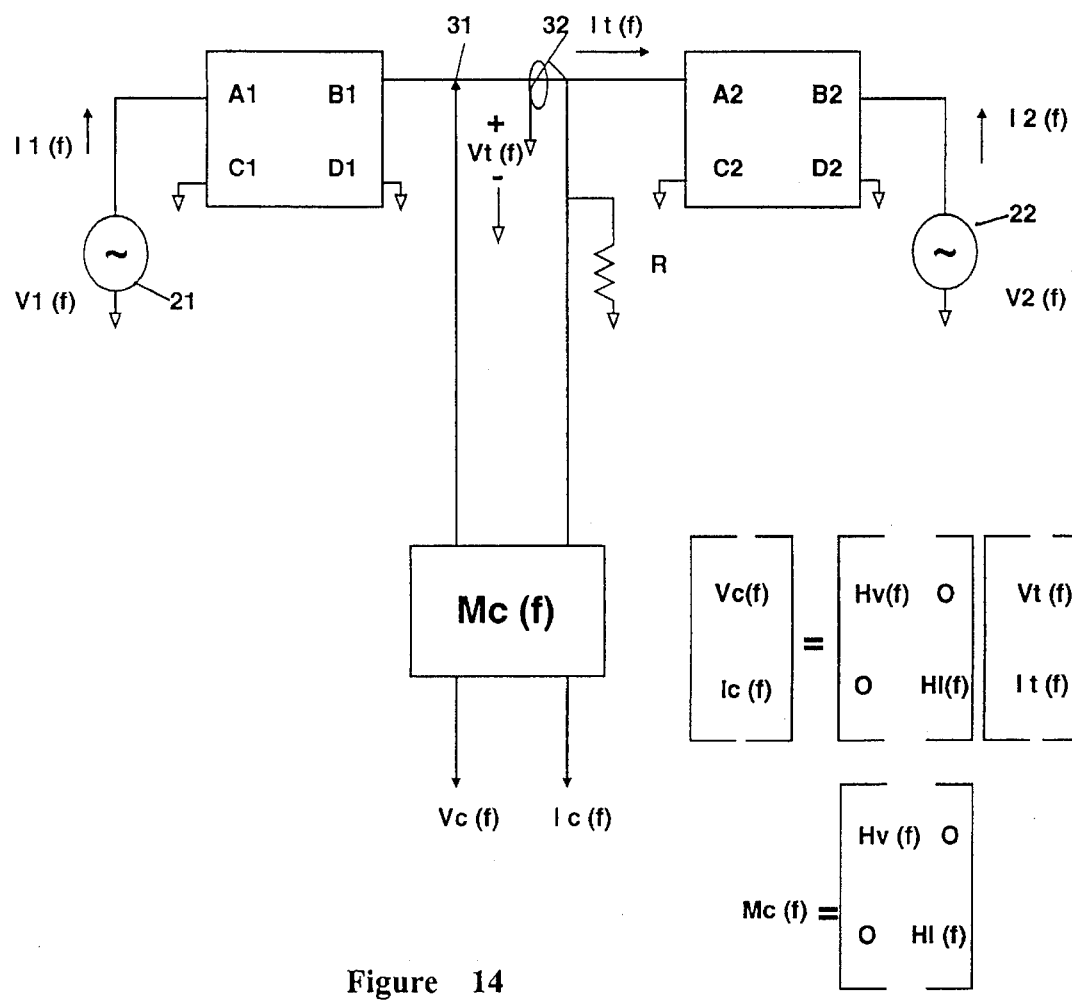
FIG. 14 shows the coupler schematic of FIG. 12 redrawn using the ABCD representation of the transmission lines.

The coupler schematic of FIG. 12 may be redrawn using the ABCD representation of the transmission lines as shown in FIG. 14. In FIG. 14, probe distortion filters are embedded within a matrix Mc(f). It will be observed that the voltage Vt(f) and the current It(f) represent a boundary condition that both the ABCD matrices having the subscripts 1 and 2 must satisfy.

Figure 15:
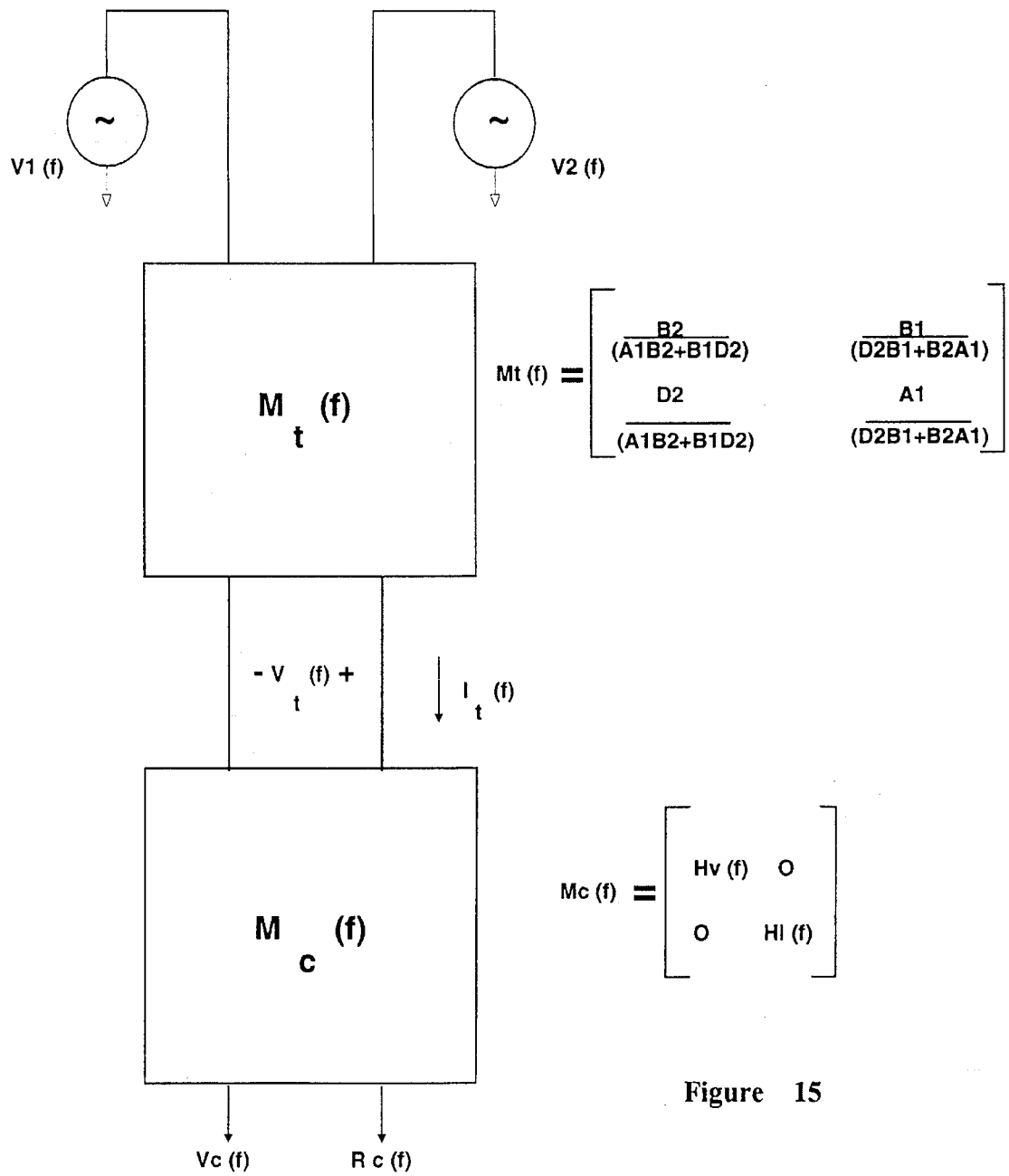
FIG. 15 diagrammatically illustrates a model for the transmission line and coupling circuitry.
Figure 16:
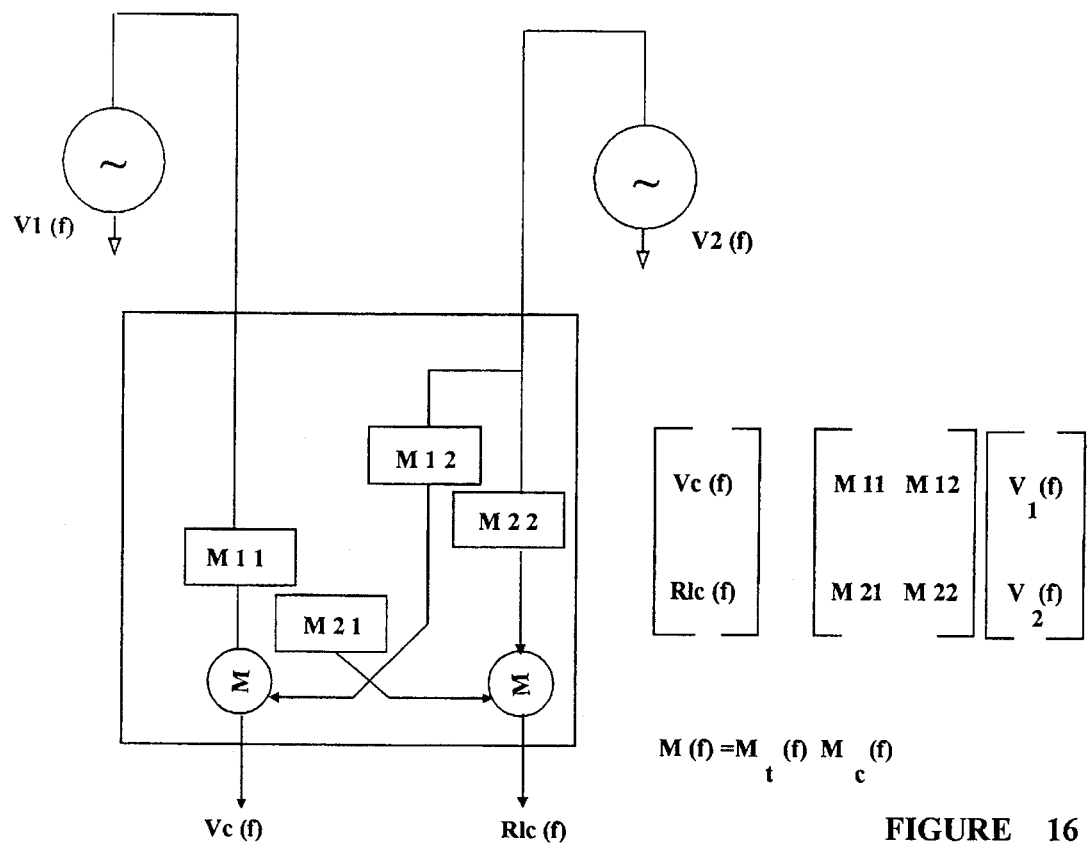
FIG. 16 illustrates matrices Mt and Mc cascaded to form Ia matrix M=Mt*Mc.

The voltage Vt(f) at voltage probe point 31 and the current It(f) at the current probe point 32 can be expressed in terms of the elements of the ABCD matrices 1 and 2. The model for the transmission line and coupling circuitry may then be redrawn as shown in FIG. 15. The matrices Mt and Mc may be cascaded to form a matrix M=Mt*Mc as illustrated in FIG. 16.

With the above definitions, the relationship between the current and voltage on the transmission line and the two desired output signals may be expressed as:

$$\begin{bmatrix} V_c(f) \\ RI_c(f) \end{bmatrix} = [M(f)] \begin{bmatrix} V_1(f) \\ V_2(f) \end{bmatrix}$$

This matrix relationship may be solved for the two driving source signals as:

$$\begin{bmatrix} V_1(f) \\ V_2(f) \end{bmatrix} = [M(f)]^{-1} \begin{bmatrix} V_c(f) \\ RI_c(f) \end{bmatrix}$$

where R is the termination resistance of the current probe 32.

The matrix W(f) and its elements that maps the output of the coupler (Vc(f) and RIc(f)) into the separated signals V1 and V2 may be defined as:

$$W(f) = [M(f)]^{-1} = \begin{bmatrix} W11(f) & W12(f) \\ W21(f) & W22(f) \end{bmatrix}$$

Figure 17:
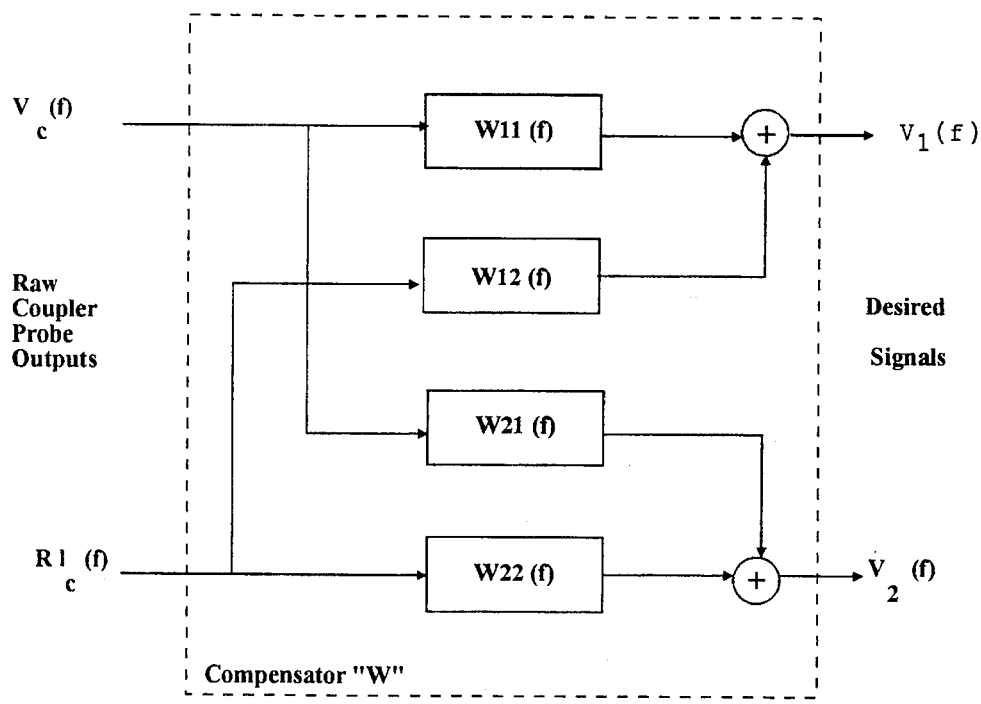
FIG. 17 diagrammatically illustrates an implementation of a signal compensating matrix W(f), which compensates for the distortions inherent in the voltage and currents probes plus transmission line impedance.
Figure 18:
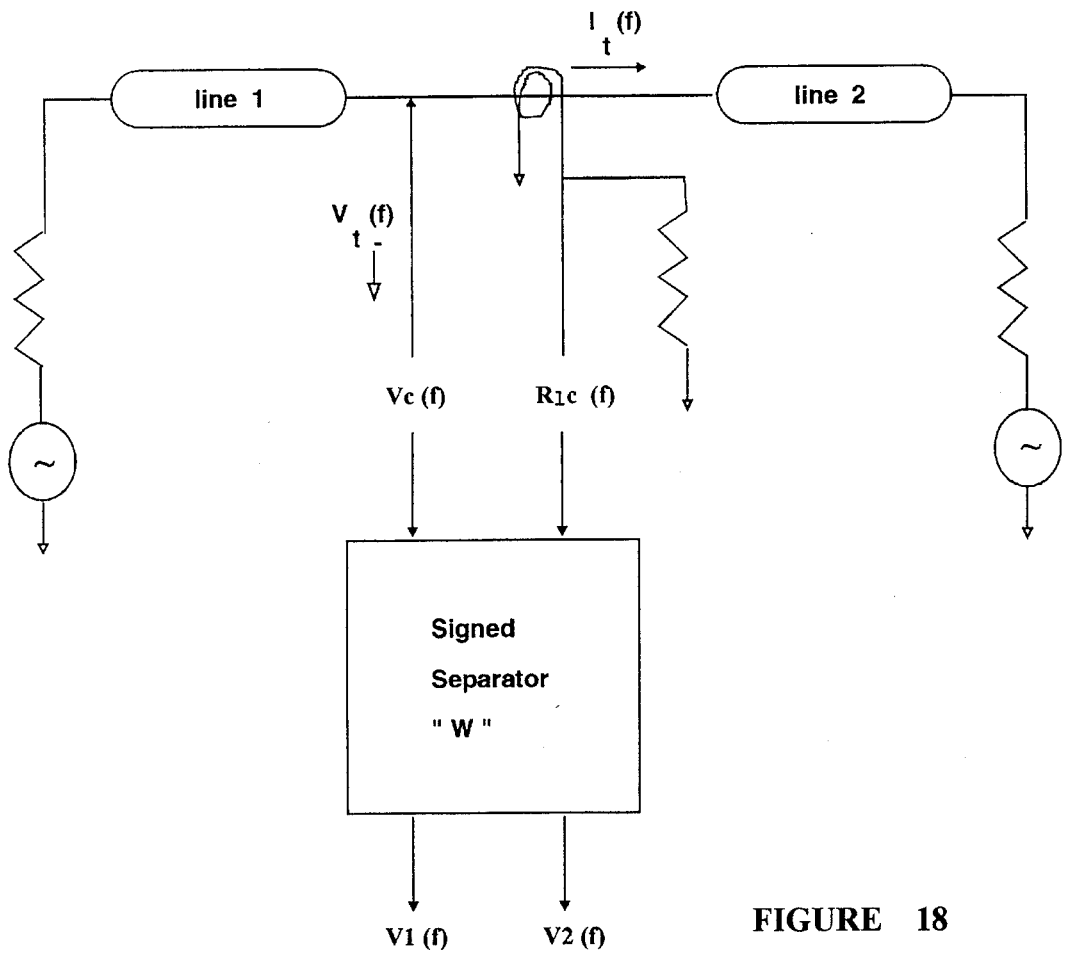
FIG. 18 schematically shows a compensated bi-directional coupler, depicting a directional signal separator 'W' coupled to a voltage probe and a current probe and producing outputs V1(f) and V2(f)

FIG. 17 diagrammatically illustrates an implementation of the signal compensating matrix W(f), which compensates for the distortions inherent in the voltage and currents probes plus the transmission line impedance. The resulting compensated bi-directional coupler is schematically shown in FIG. 18, which shows the directional signal separator 'W' coupled to voltage probe 31 and current probe 32 and producing outputs V1(f) and V2(f).

As pointed out previously, the compensation of the bi-directional coupler is effective at only one frequency. To accommodate multiple frequencies, consider performing the above described mechanism over multiple frequency bins and how a discrete Fourier transform may be implemented. Each of the frequency dependent entries in the compensating matrix W is a complex number. Conceptually, the values of these entries can be determined using an algorithm that sets either V1(f) or V2(f) to zero, while monitoring either VT(f) or RIT(f) to fill in the entries of the M matrix. This M matrix may then be inverted to produce the W matrix, as follows.

$M_{11}(f) = V_T(f)/V_1(f) : V_2(f) = 0$ $M_{12}(f) = V_T(f)/V_2(f) : V_1(f) = 0$ $M_{21}(f) = RI_T(f)/V_1(f) : V_2(f) = 0$ $M_{22}(f) = RI_T(f)/V_2(f) : V_1(f) = 0$

Since the object is not merely separating sinusoidal tones, but in separating and restoring time domain waveforms, the frequency response and/or the impulse response of the transmission line path should be known. For this purpose the frequency response can be measured in a manner consistent with a discrete Fourier transform. An inverse discrete Fourier transform (DFT) may then be defined and, the impulse response derived.

It is well known that the DFT is given by $$H(n\Omega) = \sum_{k=0}^{N-1} h(kT) e_{-j\Omega T n k}, \, n = 0, 1, \ldots, N-1$$

where h(kT) is the sampled impulse response $h(kT) = h(0), h(T), \ldots, h([N-1]T)$ and $\Omega = 2\pi/(NT)$. Likewise the IDFT is given as $$h(kT) = 1/N \sum_{n=0}^{N-1} H(n\Omega) e_{j\Omega T k n}$$

It may be assumed that the sampling rate satisfies the well known Nyquist sampling theorem. In terms of sampling the frequency response, this means that since it has been assumed that the bandwidth of interest has been restricted to be less than $F_{upper}$, the number of frequency bins associated with the DFT will be no less than $N \geq 2 F_{upper}$, implying that $T \leq 1/(2 F_{upper})$.

The N frequency responses may then be measured in order to set the elements of the N M matrices at each of these frequencies. (That is, there will be N M matrices which will be denoted as M(n) where $n = 0, 1, \ldots, N-1$). The associated W(n) matrix at frequency intervals of $F_{upper}/N$ may then be determined.

If it is assumed that the data link does not pass D.C. (as is often the case) then the first frequency bin of interest is at $F_{upper}/N$. All subsequent frequency response measurements may be referenced to this frequency. Proceeding for each of the frequency bins and for each of the elements of the M(n) matrix (the variable $\Omega$ is dropped in order to simplify notation) yields the desired inverse DFT relationships (where the notation has been again been simplified by dropping the variable T in the time domain argument). The subscript ij denotes the $ij^{th}$ element of the 2×2 matrix $[M(n)]^{-1}$.

$$h_{w11}(k) = (1/N) \sum_{n=0}^{N-1} [M(n)]_{11}^{-1} e^{j\Omega T k n}$$

$$h_{w12}(k) = (1/N) \sum_{n=0}^{N-1} [M(n)]_{12}^{-1} e^{j\Omega T k n}$$

$$h_{w21}(k) = (1/N) \sum_{n=0}^{N-1} [M(n)]_{21}^{-1} e^{j\Omega T k n}$$

$$h_{w22}(k) = (1/N) \sum_{n=0}^{N-1} [M(n)]_{22}^{-1} e^{j\Omega T k n}$$

Figure 19:
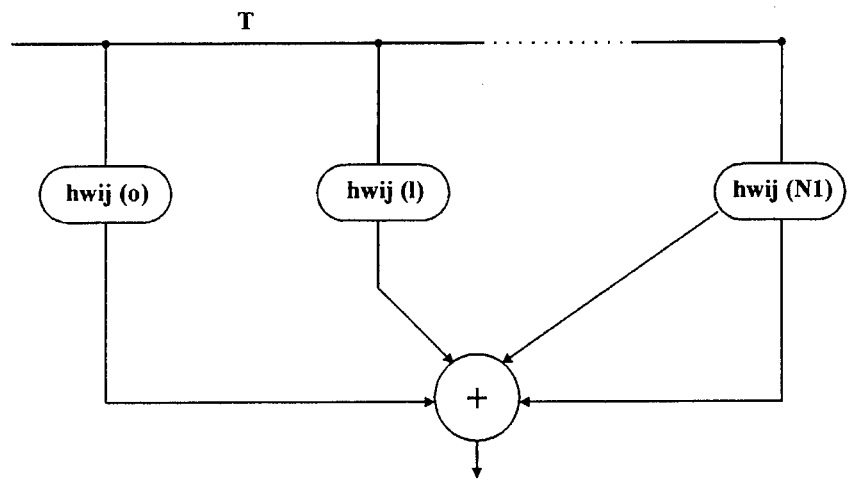
FIG. 19 diagrammatically illustrates the implementation of a compensation network W(k) as a finite impulse response (FIR) filter.

Thus, the compensation network W(k) may be implemented as a finite impulse response (FIR) filter diagrammatically illustrated in FIG. 19 having tap weights $h_{wij}(0)$, $h_{wij}(1), \ldots, h_{wij}(N-1)$, given by the above equations. To implement W(k) requires four such filters, each filter having real valued tap weights. This implies that in the frequency domain, $H_{wij}(n)$ must have even magnitude and odd phase. A time domain M(k) matrix representation of channel distortion is diagrammatically illustrated in FIG. 20, where each of the four illustrated filters has the tapped delay line structure of FIG. 19.

FIG. 21 diagrammatically illustrates an embodiment of the signal extraction scheme described in the above-referenced copending '728 application, comprised of respective pairs of voltage probes 31-1, 31-2 and current probes 32-1, 32-2, the outputs of which are coupled to respective differential amplifiers 50-1, 50-2. The differential amplifiers reject the common mode signal and amplify the differential mode signal, as required. The arrows on the current probes show the relative polarity of the current probes and indicate that for a given direction of current flow, connecting the two probes according to the arrows with respect to the current flow, will yield the same polarity of output signal from each current.

Figure 22:
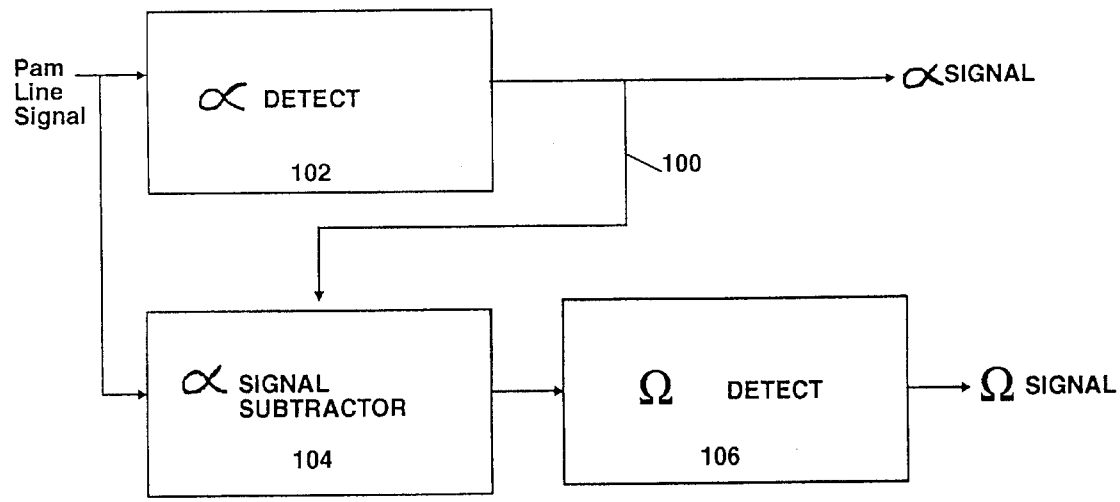
FIG. 22 diagrammatically illustrates an idealized schematic showing operation of an apparatus for blind signal separation and equalization.

Referring to FIG. 22, a system 100 is shown for separating digital pulse amplitude modulated (PAM) signals propagating in both directions on the line 23 shown in FIG. 4. Digital PAM signals are data signals having a finite number of values. The number of values depends upon the level of quantization. For example, a 4 level PAM signal may have values quantized to one of −3, −1, +1 or +3 volts.

To facilitate the description to follow, it is initially useful to define respective terms to be employed:

PAM line signal—The full duplex signals on the transmission line. The PAM line signal in FIG. 22 is observed as a voltage signal (with a voltage tap) and a current signal (with a current probe). The physical interface unit (PIU) directly interfaces to the line to obtain these signals.

Voltage signal—The voltage dynamics observed on the transmission line using a high-impedance tap like an oscilloscope probe. This signal is output by the physical interface unit (PIU) in FIG. 23. The voltage signal is comprised of both the first and second signals. The full positive and negative magnitude voltage dynamics are observed versus time.

Current signal—The current dynamics observed on the transmission line using a current probe. This signal is output by the physical interface unit (PIU) in FIG. 23. The current signal is comprised of both the first and second signals. The full positive and negative magnitude current dynamics are observed versus time.

Overall line signal—Same as PAM line signal.

Stronger PAM signal—Generally the PIU can connect to the line at a point which is closer to one line modem than to the other. Consequently, the closest modem's signal is stronger (more powerful) than the second modem's signal at the PIU. The $\alpha$ detect unit acquires the stronger signal, since it dominates the digital filter adaptation process. This signal may also be called the $\alpha$ signal. If the two signals are of nearly equal power, the $\alpha$ detect unit can easily acquire either one.

Weaker PAM signal—The complementary signal to the stronger PAM signal. This signal may also be called the $\Omega$ signal. The $\Omega$ detect unit recovers this signal.

Training—This is the process of adapting the adaptive digital filters which comprise the signal processing matrix. Well-known commonplace algorithms are used to perform the training (adaptation). In our disclosure, blind adaptation algorithms are used initially, since the signals can be highly distorted. But, during tracking a conventional decision-directed algorithm is used. The LMS (least mean square) algorithm is the most common algorithm, and it is described in any modern communications textbook.

Depending upon where the tap unit 40 is placed on the line 23, the PAM signal travelling in one direction will be electrically stronger than the PAM signal travelling in the other direction. The signal provided by the transmitter that is closest to the tap unit 40 will most likely be the stronger of the two. In FIG. 22, and for the discussion which follows, the stronger signal will be denoted as $\alpha$ and the weaker signal will be denoted as $\Omega$. For purposes of illustrating the present invention, the signals will be assumed to be 80 KHz PAM digital signals and the line 23 will be assumed to be a voice quality telephone line having a bandwidth of approximately 80 KHz. These assumed values are for illustrative purposes only. The invention can be operated with lines and PAM digital signals having different bandwidths/rates than that those employed in the discussion which follows.

The system 100 functionally comprises an $\alpha$ signal detector 102, an $\alpha$ signal subtractor 104 and an $\Omega$ signal detector 106. The output of the $\alpha$ signal detector is the $\alpha$ signal, while the output of the $\Omega$ signal detector 106 is the $\Omega$ signal. The PAM voltage and circuit line signals are sensed and provided to the $\alpha$ signal detector 102, which filters out the line distortion and attenuates the $\Omega$ signal (by means illustrated hereinafter) to provide the $\alpha$ signal as an output.

The $\alpha$ signal subtractor 104 is provided with the PAM line signals as one input and with the $\alpha$ signal as another input. The effect of the $\alpha$ signal on the overall line signal is subtracted from the line signal at the $\alpha$ signal subtractor 104 (by means illustrated hereinafter). The output that is provided is a signal that would be on the line if the $\alpha$ signal had not been transmitted. That is, the $\alpha$ signal is subtracted from the overall line signal. The output of the $\alpha$ signal subtractor 104 is provided to the $\Omega$ signal detector 106, which eliminates the line distortion of the $\Omega$ signal (by means illustrated hereinafter) and provides the undistorted $\Omega$ signal as an output.

Figure 23:
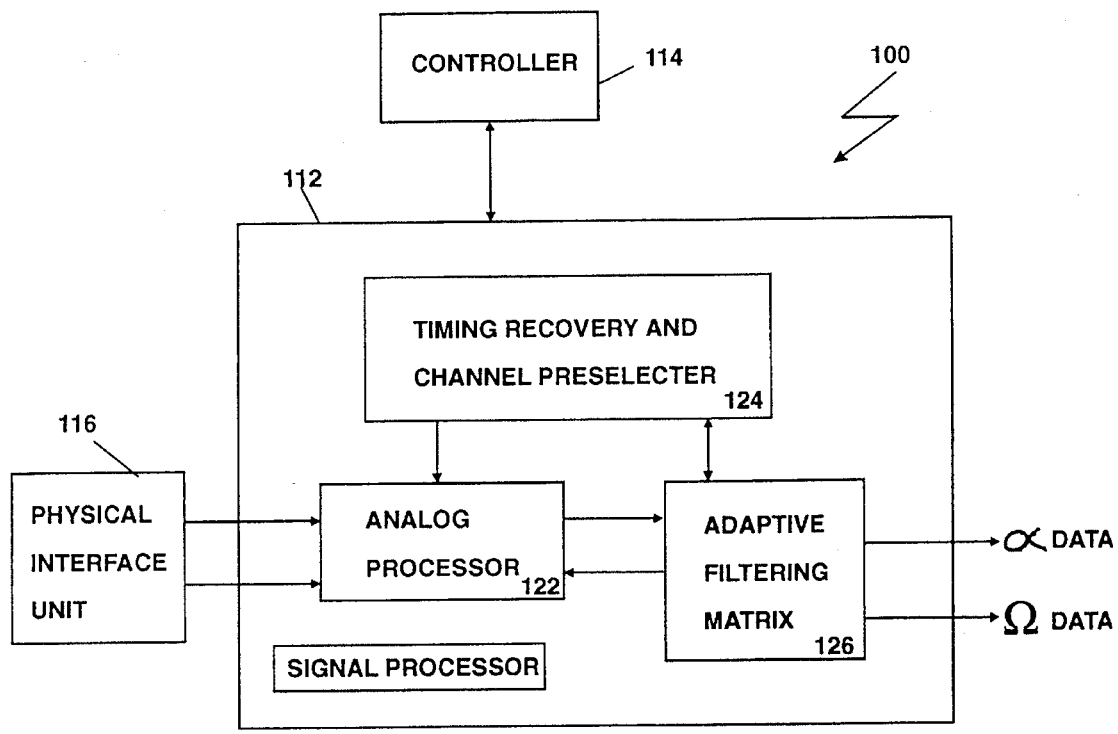
FIG. 23 diagrammatically illustrates an exemplary embodiment of an apparatus for blind signal separation and equalization according to the present invention.

FIG. 23 is a diagram illustrating actual hardware and/or software that can be used to implement the system 100 of FIG. 22. For portions of the system 100 described hereinafter, the choice of whether to use hardware, software, or a combination thereof is a design choice based on a variety of functional factors known to one skilled in the art. In many instances, the particular selected means of implementation would be apparent to one of ordinary skill in the art and therefore will not be discussed further herein.

A signal processor 112 is connected to and communicates with a controller 114 and with a physical interface unit 116. The physical interface unit 116 is analogous to the tap unit 40, described above, and hence will not be discussed any further except to note that the physical interface unit 116 provides a voltage signal and a current signal indicative of the voltage and current on the line 23 shown in FIG. 4. The controller 114 senses conditions in and provides signals to the signal processor 112. Implementation of the controller 114 will not be discussed any further except to note that the implementation thereof would be straightforward to one of ordinary skill in the art based upon the functional description of operation which follows herein.

The signal processor 112 comprises an analog processing unit 122, a timing recovery and channel preselector unit 124 and an adaptive filtering matrix 126. The line voltage signal and line current signal are provided by the physical interface unit 116 to the analog processing unit 122 which subsequently conditions the signal, and performs an A/D conversion of the voltage and current signals. The timing recovery and channel preselector unit 124 is used to synchronize the signal processor 112 to the clock speed of the data signal provided on the line 23. The signal clock speed is provided to the analog processor 122 in order to synchronize the A/D converter sample rate thereto. The adaptive filtering matrix unit 126 processes digital signals from the analog processing unit 122 and provides a first data signal and a second data signal indicative of the α and the Ω signals, respectively. The adaptive filter matrix 126 also provides signals to the timing recovery and channel preselector unit 124 and to the analog processing unit 122.

Figure 24:
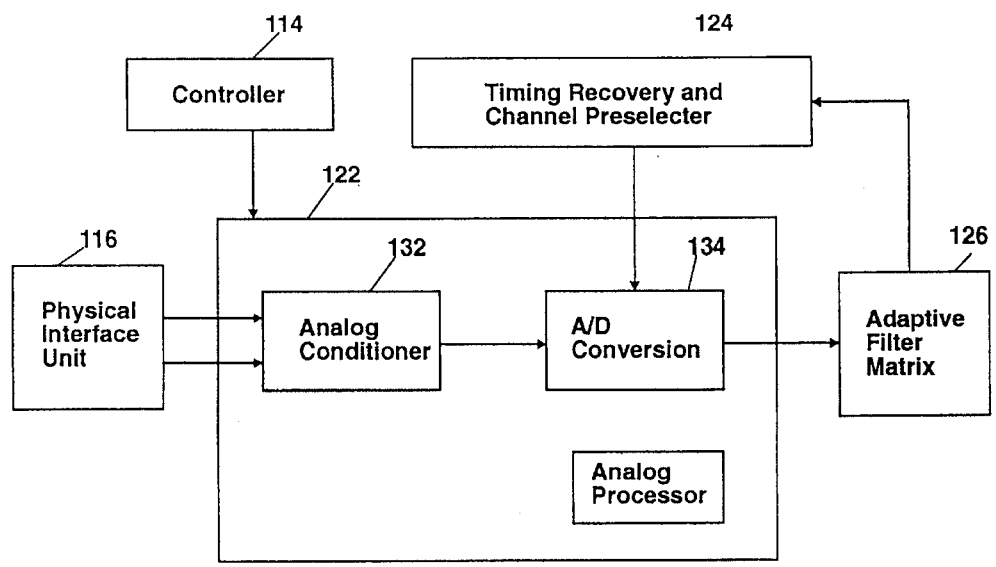
FIG. 24 diagrammatically illustrates an exemplary embodiment of an analog processing unit for an apparatus for blind signal separation and equalization according to the present invention.

Referring to FIG. 24, the analog processing unit 122 comprises an analog conditioner 132 and an A/D converter 134. The analog conditioner 132 low pass filters the signals provided by the physical interface unit 116 in order to attenuate frequencies above the PAM symbol rate of 80 KHz. The analog conditioner unit 132 also contains automatic gain control means for adjusting the magnitude of the analog signals to be within the dynamic range of the A/D conversion unit 134. The A/D conversion unit 134 converts the analog signals provided by the analog conditioning unit 132 into digital signals which are subsequently provided to the adaptive filter matrix unit 126.

Figure 25:
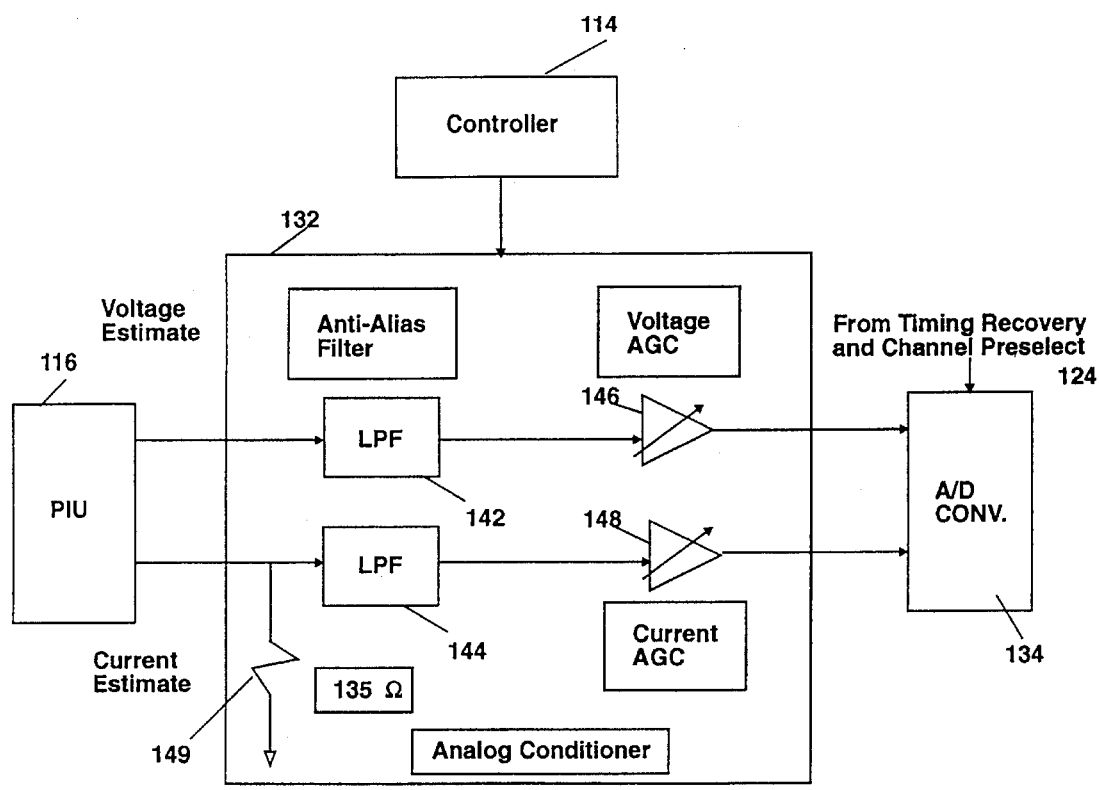
FIG. 25 diagrammatically illustrates an exemplary embodiment of an analog conditioner for a analog processing unit according to the present invention.

Referring to FIG. 25, the analog conditioning unit 132 comprises a first low pass filter 142, a second low pass filter 144, a voltage AGC unit 146, and a current AGC unit 148. The first low pass filter 142 filters out signal components above 80 KHz from the line voltage signal provided by the physical interface unit 116. The output of the first low pass filter 142 is provided to the voltage AGC 146 which automatically adjusts the level of the voltage signal so that the magnitude is within the dynamic range of the A/D conversion unit 134.

Similarly, the line analog current signal from the physical interface unit 116 is provided to the second low pass filter 144. In this case, however, the line analog current signal is converted to an analog voltage signal by a 135 ohm resister 149. The second low pass filter 144 filters out signal frequency components greater than 80 KHz. The output of the second low pass filter 144 is provided to the current AGC 148 which, just as with the voltage AGC 146, adjusts the magnitude of the analog current signal to be within the dynamic range of the A/D conversion unit 134. Implementation of the AGC's 146, 148 is straight-forward to one of ordinary skill in the art. The AGC's 146, 148 can self-adjust and detect signal strength by a variety of known means, such as measuring signal power.

Figure 26:
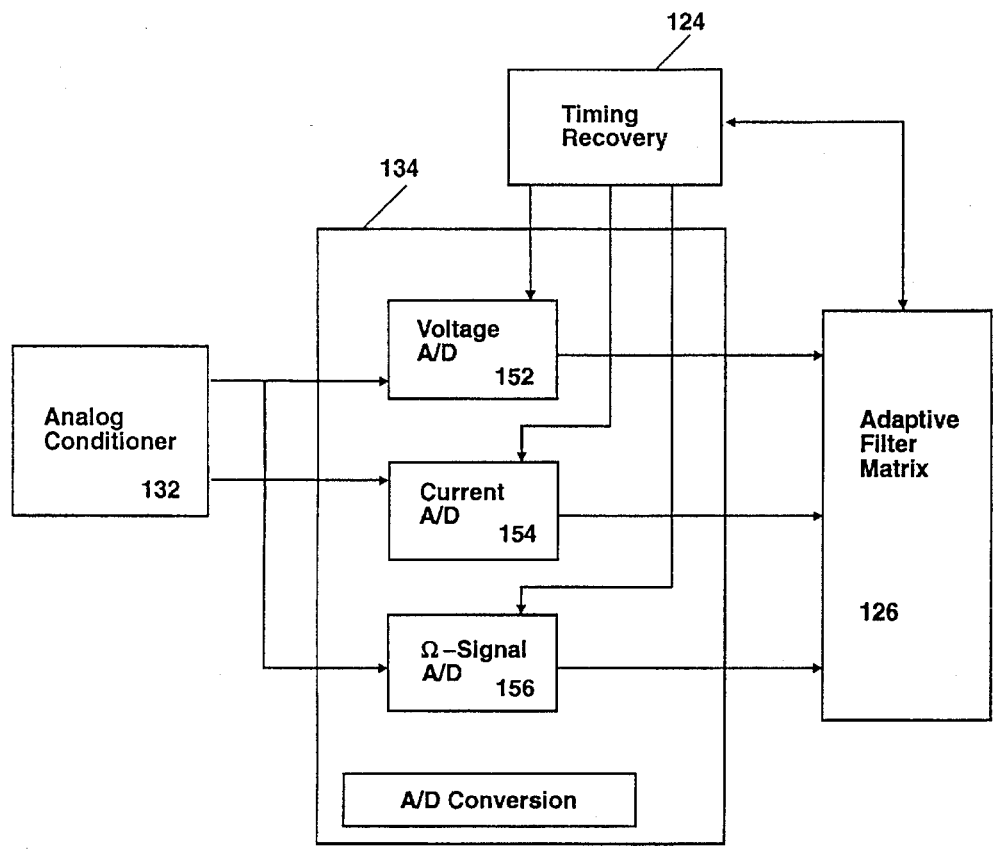
FIG. 26 diagrammatically illustrates an exemplary embodiment of an A/D converter for an analog processing unit according to the present invention.

Referring to FIG. 26, the A/D conversion unit 134 comprises a voltage A/D unit 152, a current A/D unit 154 and an Ω signal A/D unit 156. The sampling rates of the units 152, 154, 156 are determined by the timing recovery and channel preselect unit 124, which provides a sample rate signal corresponding to the signal rate of the data signal on the line 23. The A/D's sample the data according to the magnitude of the sample rate signal.

The voltage A/D unit 152 converts the analog voltage signal provided by the analog conditioner unit 132 into a digital voltage signal that is subsequently provided to the adaptive filter matrix unit 126. Similarly, the current A/D unit 154 converts the analog current signal provided by the analog conditioner unit 132 into a digital current signal that is provided to the adaptive filter matrix unit 126. The Ω signal A/D unit 156 converts the analog output of the analog conditioner 132 into a digital signal that is provided to the adaptive filter matrix unit 126.

Figure 27:
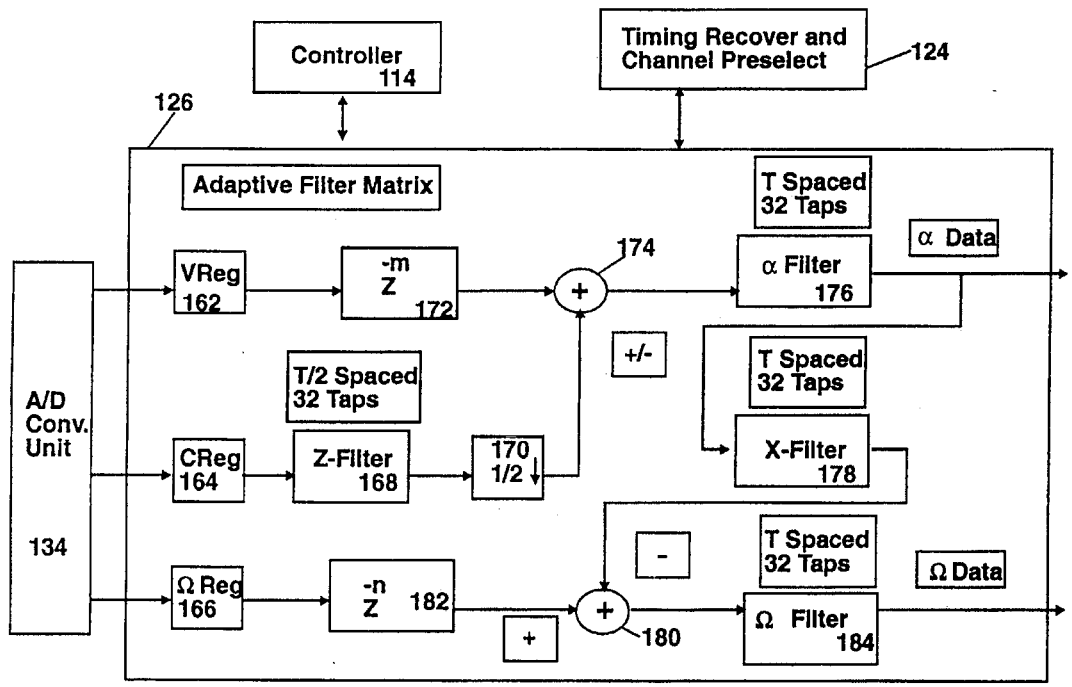
FIG. 27 diagrammatically illustrates an exemplary embodiment of an adaptive filter matrix unit for an apparatus for blind signal separation and equalization according to the present invention.

Referring to FIG. 27, the adaptive filter matrix unit 126 receives digital inputs from the A/D converter unit 134 and provides the αsignal data and Ω signal data as two separate outputs. To facilitate a description of FIG. 27, the relationship between the filter structure of FIG. 20 and the upper portion of FIG. 27 will be initially described.

The lattice structure processing may be described using matrix mathematics referenced above with respect to FIG. 17. The following equation defines this structure.

$$W(f) = \begin{bmatrix} W11(f) & W12(f) \\ W21(f) & W22(f) \end{bmatrix}$$

The voltage signal and current signal are processed to recover the two individual transmit signals. This is described by the following equation.

$$\begin{bmatrix} V1(f) \\ V2(f) \end{bmatrix} = \begin{bmatrix} W11(f) & W12(f) \\ W21(f) & W22(f) \end{bmatrix} \begin{bmatrix} Vc(f) \\ RIc(f) \end{bmatrix}$$

The lattice structure is awkward to work with in practice because both signal separation and equalization occur at the same time. There is no easy way to initialize and adapt the digital filters automatically. A much easier structure can be derived by manipulating the preceding equation into $$\begin{bmatrix} V1(f) \\ V2(f) \end{bmatrix} = \begin{bmatrix} W11(f) & 0 \\ 0 & W21(f) \end{bmatrix} \begin{bmatrix} 1 & \frac{W12(f)}{W11(f)} \\ 1 & \frac{W22(f)}{W21(f)} \end{bmatrix} \begin{bmatrix} Vc(f) \\ RIc(f) \end{bmatrix}.$$

This can be rewritten as $$\begin{bmatrix} V1(f) \\ V2(f) \end{bmatrix} = \begin{bmatrix} W11(f) & 0 \\ 0 & W21(f) \end{bmatrix} \begin{bmatrix} 1 & Z1(f) \\ 1 & Z2(f) \end{bmatrix} \begin{bmatrix} Vc(f) \\ RIc(f) \end{bmatrix}$$

where:

$$Z1(f) = \frac{W12(f)}{W11(f)} \text{ and } Z2(f) = \frac{W22(f)}{W21(f)}$$

Figure 28:
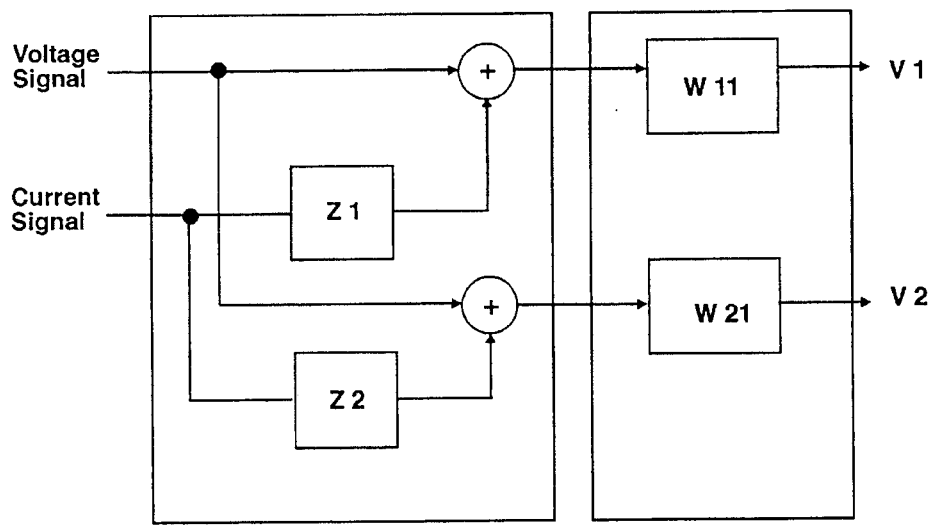
FIG. 28A diagrammatically illustrates respective signal separation and equalization stages for voltage and current signals.
FIG. 28B diagrammatically illustrates an alpha detection unit.
FIG. 28C diagrammatically illustrates the location of a probe relative to respective west and east ends of a transmission line.
FIG. 28D diagrammatically illustrates a full duplex wire line modem architecture.
FIG. 28E diagrammatically illustrates a signal processing architecture for recovering an omega data signal from respective voltage and alpha data signal inputs.
Figure 28:
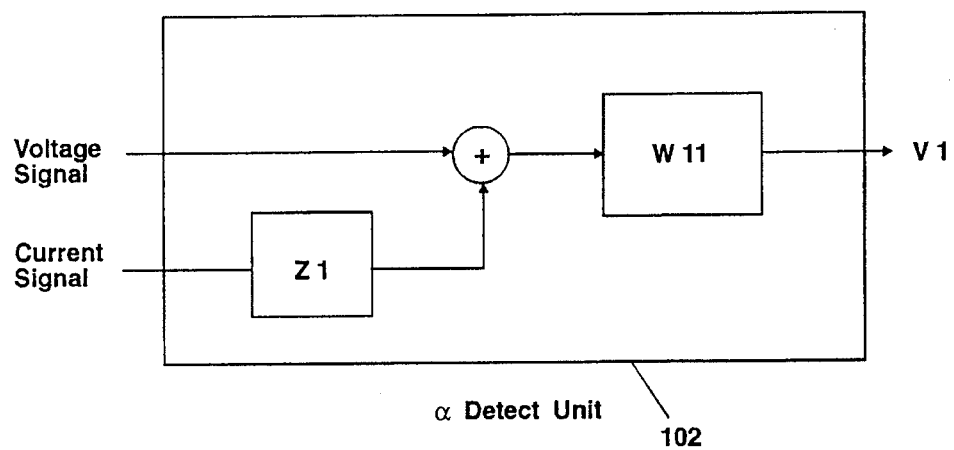
Figure 28:
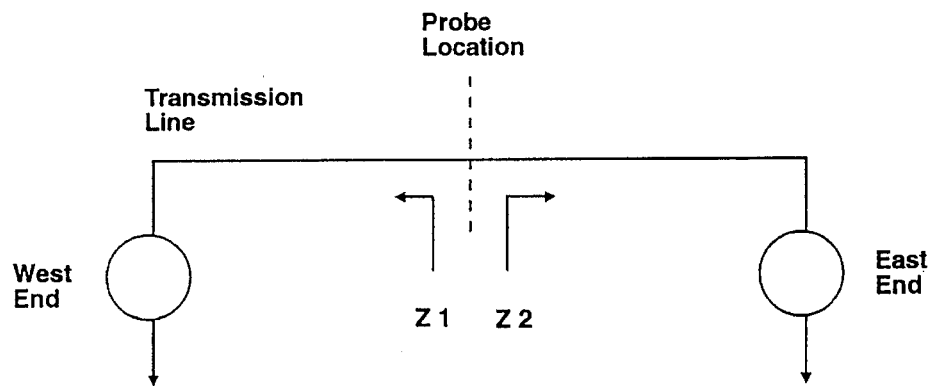
Figure 28:
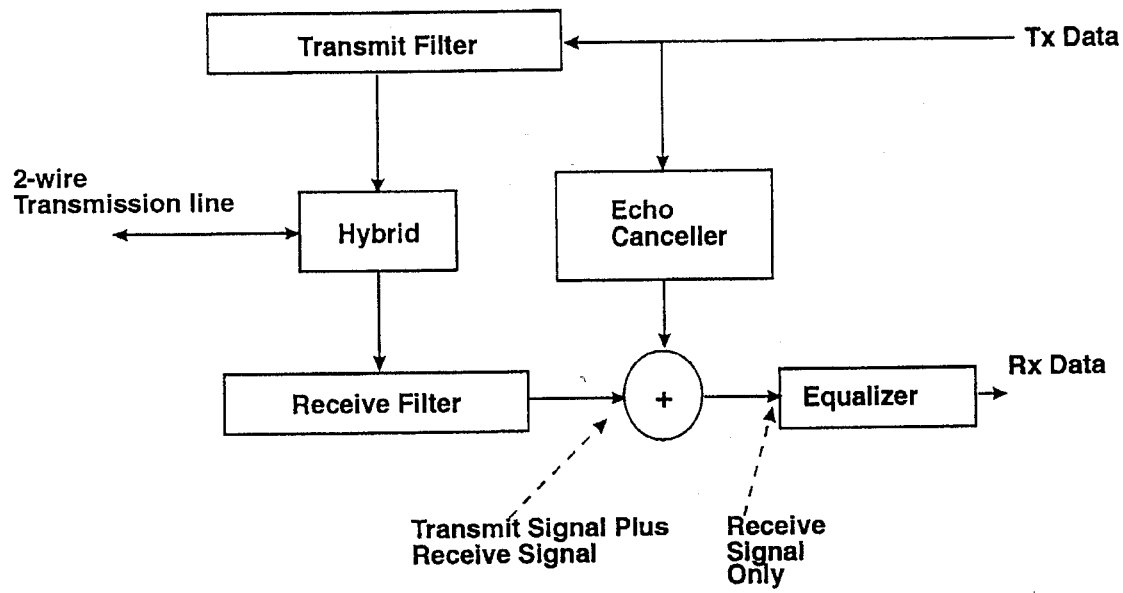
Figure 28:
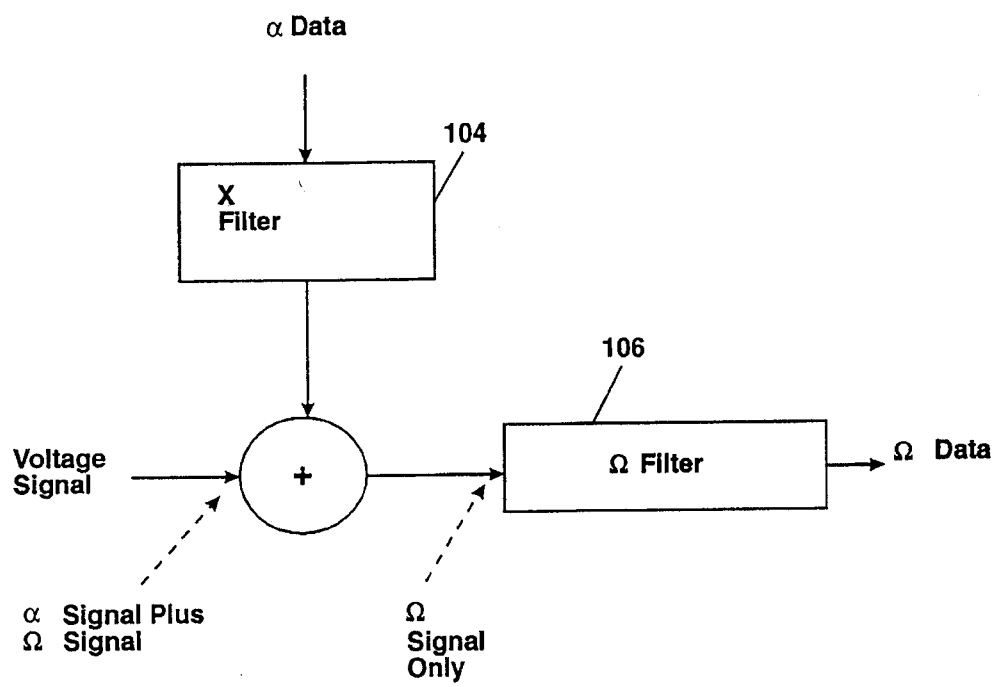

This new equation describes two stages of processing as shown in FIG. 28A. Again, four digital filters are required, but they are now decoupled in terms of function. The first matrix (stage) containing the Z's is a stage of processing which completely separates the two signals. The interference cancellation occurs at the summing junction. This can be seen by realizing that if the output of W11 contains only signal V1 then the input to the linear filter W11 must also. Also, if the output of W21 contains only signal V2 then the input to the linear filter W21 must also.

The second stage of processing containing the W's is required because the signals are distorted. Even though the signals have been separated by the signal separation stage, equalization is required to clean-up the signal and restore the eye pattern. The W's are decision feedback equalizers (DFE) because they are best for ac-coupled PAM signals.

In the present invention, the upper channel architecture complete defines the α detect unit 102 in FIG. 22. FIG. 28B diagrammatically illustrates this point by observing that the equivalent elements are the Z filter and the α detect unit completely separates and equalizes one of the two signals.

What is particularly convenient about this new architecture is the fact that Z1 and Z2 are identically equal to impedances on the line. If the line were to be cut at the probe location (although it is not in accordance with the invention) and the line impedances measured looking toward the West End and the East End, those impedances would be Z1 and Z2, respectively, as seen in FIG. 28C. In other words, if someone knew the line impedance characteristic versus frequency, the two signals can be completely separated without adaptation by setting the digital filters Z1 and Z2 to those values.

This is particularly convenient, since the line impedance is generally known to within 30%. Consequently, the Z filters can be initialized to these approximate values before attempting acquisition. The adaptation (blind adaptation and decision directed adaptation) will adjust the filters to their exact values.

The α detect unit is used to capture the strongest signal on the line, since this is the easiest one to acquire. The α detect unit is the first structure to adapt. If the two signals are roughly the same power, either one can be captured first by the α detect unit. The α signal is the signal which is acquired first—either V1 (west end) or V2 (east end).

The relationship between FIG. 20 and the bottom half of FIG. 27 will now be described.

Once the first signal is acquired by the α detect unit, it is much easier to acquire the second signal using an architecture borrowed from full-duplex wireline modems. Full duplex wireline modems have an interference problem also. The full-duplex wireline modem architecture is shown in the FIG. 28D.

The full-duplex (tx and rx signals) travel on the 2-wire transmission line. The modem couples to the line with a hybrid transformer. Unfortunately, some of the transmit signal leaks onto the receive signal through the hybrid transformer. An adaptive filter called an echo canceler is used to cancel the transmit signal interfering with the receive signal. The input to the echo canceler is the transmit data. Once the interference is canceled, distortion exists which must be equalized to recover the rx data.

This same architecture is used in the present invention to recover the second signal (once the first signal's data is successfully being recovered). FIG. 28E shows the similarities. The X Filter is identical to the echo canceler, and it trains in the same fashion. The Ω Filter is identical to the full-duplex modem's equalizer. The X Filter is adapted after the α detect unit is acquired but before the Ω Filter is adapted.

FIG. 28D may be compared with FIG. 27 to identify these filters. The α Signal Subtractor 104 in FIG. 22 is the X Filter. The Ω Detect unit 106 in FIG. 22 is the Ω Filter. It is a decision feedback equalizer (DFE) because it is best for accoupled PAM signals.

A digital data value indicative of the magnitude of the voltage on the line 23 is stored in a register 162 labeled VReg. Similarly, a digital data value indicative of the magnitude of the current on the line 23 is stored in a register 164 labeled CReg. A digital data value indicative of the magnitude of the output of the Ω signal is stored in a register 166 labelled ΩReg. The registers 162, 164, 166 are implemented using circular digital buffers in a manner known to one skilled in the art.

A Z-filter 168, which is a T/2 spaced 32 tap FIR adaptive digital filter, known to one skilled in the art, is provided with the digital data value from the CReg register 164. The Z-filter 168 approximates the impedance experienced by the Ω signal. Note that the line current (i.e. the contents of the CReg register 164) multiplied by the impedance experienced by the Ω signal is an approximation of the Ω signal voltage (i.e., V=Z*I). The digital current signal is sampled at twice the rate of the other signals (hence the T/2 designation of the taps of the Z-filter 168), but the output of the Z-filter 168 is provided to a frequency halving unit 170, which halves the number of samples. The output rate of the halving unit 170 is therefore the same rate as other digital signals used by the adaptive filter matrix unit 126.

The line digital voltage signal, which is stored in the VReg register 162, is provided to a delay unit 172. The delay unit 172, which is designated as $Z^{-m}$, delays the contents of the VReg register 162 by M samples. This delay is performed in order to synchronize combining the filtered digital current signal and the digital voltage signal after the digital current signal has been filtered by the Z-filter 168. Since the Z-filter 168 introduces a delay, the delay unit 172 is used to introduce a similar delay for the digital voltage signal.

The delayed digital voltage signal and the filtered digital current signal (which approximates the Ω signal voltage) are combined at a summation unit 174, which either adds or subtracts the filtered digital current signal to or from the digital voltage signal. Whether an addition or a subtraction is performed depends upon the direction of the α (strongest) signal. Sensing the direction of the α signal is described in more detail, below. Since the Z-filter 168 represents the impedance seen by the Ω signal, the output of the Z-filter 168 that is subtracted at the summation unit 174 represents the Ω signal voltage. Therefore, the output of the summation unit represents the line voltage minus the contribution of the Ω signal to the line voltage.

The combination of the digital voltage signal and the filtered digital current signal are output from the summation unit 174 and provided to an α filter 176. The α filter 176 is a T spaced 32 tap adaptive FIR digital decision feedback equalizer filter, known to one skilled in the art. Four of the taps feed forward while twenty-eight of the taps feed back. The decision output that is fed back is a quantization of the possible values of the digital PAM signal. That is, the output of the four feed-forward taps is quantized to the nearest PAM signal level and then fed back to the 28 feedback taps. The α filter 176 eliminates distortion that is introduced when the 80 KHz α signal is propagated through the 80 KHz bandwidth data line 23. The α filter 176 also compensates for deleterious effects of the Z-filter 168 on the α signal. The output of the α filter 176 is provided as the α signal, which is output from the adaptive filter matrix unit 126.

The α signal is also provided as an input to an X-filter 178, which is an adaptive FIR digital filter having T spaced 32 taps, known to one skilled in the art. The X-filter 178 redistorts the 80 KHz α signal so that the signal appears as it would on the line 23. That is, the X-filter 178 outputs a signal that would appear on the line 23 if only the α signal were transmitted on the line 23. The output of the X-filter 178 is provided to a summing unit 180.

The ΩReg register 166 contains a digital signal indicative of the analog output of the Ω signal, described above, which is a first order approximation of the Ω signal. The contents of the ΩReg register 166 are provided to a delay unit 182, which delays providing the contents of the ΩReg register 166 to the summation unit 180. The amount of the delay is equal to the delay of the signal processing of the digital voltage signal and the digital current signal, described above. That is, the delay of the delay unit 182 equals the sum of the delays of the Z-filter 168, the α filter 176, and the X-filter 178. Therefore, the output of the delay unit 182 is synchronized with the output of the X-filter 178 so that the signals provided to the summation unit 180 represent data that was sampled at the same time.

The summation unit 180 subtracts the output of the X-filter 178 from the first order approximation of the Ω signal.

The output of the summation unit 180 is provided to an Ω filter 184, which filters out distortion from the signal in a manner similar to the filtering performed by the α filter 176. The Ω filter 184 is a T spaced 32 tap adaptive FIR digital filter, known to one skilled in the art. The output of the Ω filter 184 is the Ω signal data.

Figure 29:
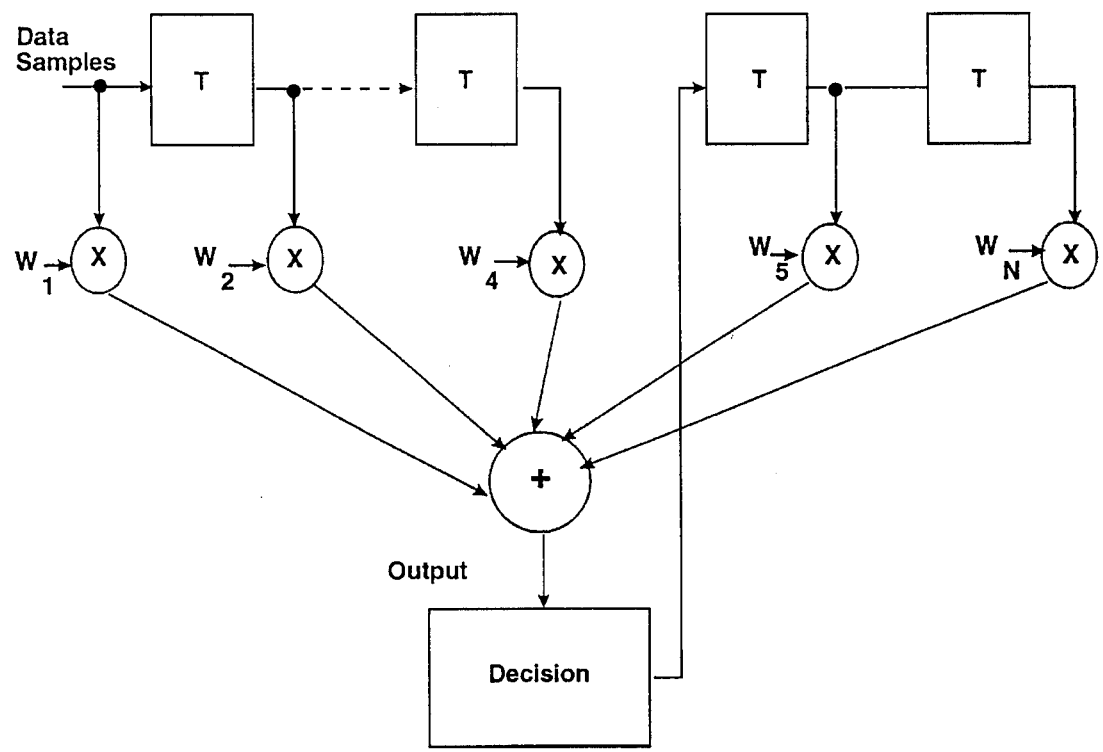
FIG. 29 diagrammatically illustrates an FIR adaptive digital filter having provision for decision feedback equalization.
Figure 30:
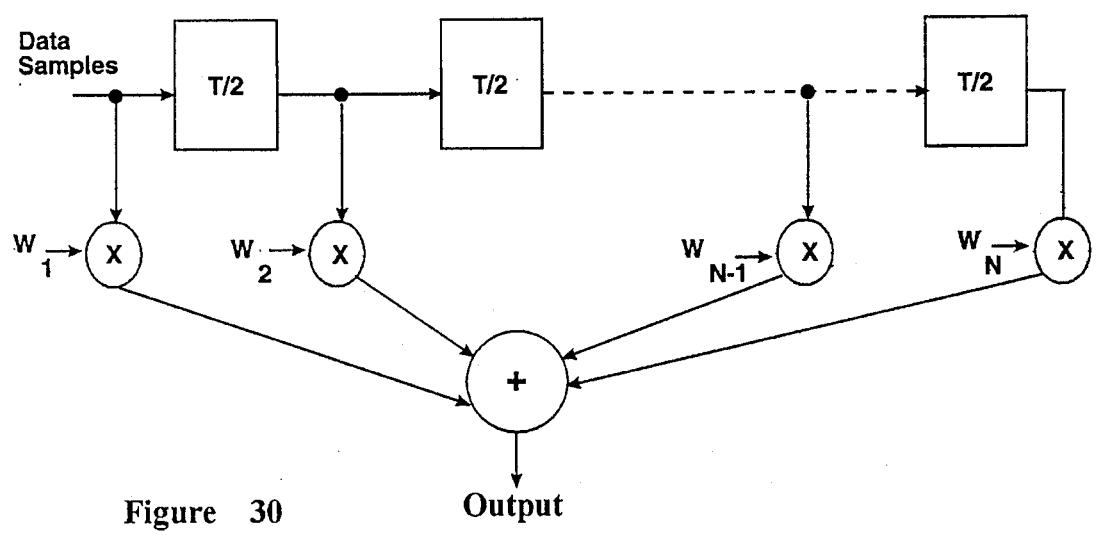
FIG. 30 diagrammatically illustrates an FIR adaptive digital filter.

The underlying structures of the filters 168, 176, 178, 184 are shown in FIG. 29 and FIG. 30. The structure of the α and the Ω filters 176, 184 is shown by FIG. 29. As described above and as shown in the Figure, the input data is provided to the first four feed forward taps. The box in FIG. 29 labelled "Decision" represents quantization of the output value to one of the possible PAM values. For instance, if there are four possible PAM values, −3, −1, +1 and +3, then the box labelled "Decision" would provide an output equal to the one of those four values that is nearest to the value of the "Output" signal. The output of the decision box is fed back to the 28 feedback taps shown in FIG. 29.

The Z-filter 168 and the X-filter 178 structures are shown by FIG. 30, which illustrates an adaptive digital filter with no decision feedback. The taps of the filter of FIG. 30 are labelled T/2, thereby indicating the T/2 spaced taps of the Z-filter 168. However, the taps of the filter of FIG. 30 could also represent the taps of the X-filter 178, even though the taps of the X-filter 178 are T spaced. In the filter of FIG. 30, all of the tap values are weighted and summed to provide the "Output" signal. Note that the input data is shifted all the way through all of the taps. This contrasts with the filter of FIG. 29 where the decision data is shifted through the feedback taps. The magnitude of the weights of all of the filters 168, 176, 178, 184 is determined by means illustrated in more detail hereinafter.

The timing recovery and channel preselect unit 124 shown in FIGS. 23, 26 and 27 uses information from the adaptive matrix unit 126 in order to detect the clock speed of the signal being provided on the line 23. The signal on the line 23 will have a given clock speed which will vary by plus or minus a small amount due to electronic circuit hardware tolerance errors, temperature drift, or other factors that effect the clock speed of a transmitted signal. The timing recovery and channel preselect unit 124 compensates for this small variance by scanning the range of possible signal clock rates and locking onto the rate which provides for the best data recovery. A signal from the adaptive filter matrix unit 126 is provided to the timing recovery and channel preselect unit 124 to indicate whether or not data is being recovered (i.e., whether or not signals are being detected and separated into $\alpha$ and $\Omega$ signals). If data is being recovered at a particular frequency, then the signal from the adaptive filter matrix unit 126 is provided to the timing recovery and channel preselect unit 124 to indicate that the desired frequency has been attained and that therefore the timing recovery and channel preselect unit 124 should lock onto that frequency. Conversely, if data is not being recovered, then a signal is provided by the adaptive filter matrix unit 126 to the timing recovery and channel preselect unit 124 to indicate that frequency scanning should continue.

Operation of the timing recovery and channel preselect unit 124 can be illustrated by the following example: Suppose that the 80 KHz signal being transmitted on the line 23 has a possible error of plus or minus 1 Hz. The timing recovery and channel preselect unit 124 will begin operation at exactly 80 KHz. If no data can be recovered at this rate, the adaptive filter matrix unit 126 will so indicate by a signal provided to the timing recovery and channel preselect unit 124 and the timing recovery and channel preselect unit 124 will change frequencies and begin operation at 80 KHz plus 0.1 Hz. If no data is recovered at this frequency of operation, then the timing recovery and channel preselect unit 124 switches to 80 KHz+0.2 Hz. All of the frequencies between 80 KHz plus or minus 1 Hz are tried in 0.1 Hz increments until one of the frequencies which results in sufficient data recovery is found. When this frequency is found, the adaptive filter matrix unit 126 sends an appropriate signal to the timing recovery and channel preselect unit 124 indicating that the frequency is correct and should be locked onto (i.e. not changed to another frequency).

The adaptive digital filters 168, 176, 178, 184 that are used in the adaptive filter matrix unit 126 are all initialized and trained in a specific manner. Training an adaptive filter involves adjusting the weights of the filter until the desired output is reached. The weights of the Z-filter 168 are initialized so that the Z-filter 168 approximates the impedance experienced by the $\Omega$ signal on the line 23. This impedance can be approximated by setting the Z-filter 168 according to the impedance of the line 23. The $\alpha$ filter 176 and the $\Omega$ filter 182, which are decision feedback equalizer filters, are initialized such that all of the weights equal zero except for the one weight associated with the least significant feed forward tap, which is initialized to a weight of unity. Therefore, for the first few iterations, the output of the $\alpha$ filter 176 will track the input and the output of the $\Omega$ filter 182 will track the input. The weights of the X-filter 178 are all initialized to zero.

The Z-filter 168 and the $\alpha$ filter 176 are trained simultaneously in order to obtain the $\alpha$ data signal. Both of the filters 168, 176 initially use a blind adaptation algorithm, such as the stop and go algorithm, a modification of the Sato algorithm. Those algorithms are familiar to one of ordinary skill in the art. The weights of both of the filters 168, 176 are adjusted according to the difference between the $\alpha$ signal and a version of the $\alpha$ signal quantized to the nearest PAM level.

Following the initialization phase of the Z-filter 168 and of the $\alpha$ filter 176, the stop and go algorithm is no longer used and the weights of the filters 168, 176 are adjusted using a decision-directed algorithm, where the weights are still adjusted according to the difference between the output and the quantized PAM output of the $\alpha$ filter 176, but the loop bandwidth of the weight adjusting function that is used is smaller. Using a smaller loop bandwidth decreases the rate at which the weights vary from iteration to iteration.

The X-filter 178 is trained after the Z-filter 168 and the $\alpha$-filter 176 have been trained. The X-filter 178 cannot be trained until $\alpha$ data has been acquired. The X-filter 178 is trained to drive the $\alpha$ signal to zero. That is, the weights of the X-filter 178 are modified to attempt to cause the value in the $\Omega$ register 166 to be equal to zero at the output of the summation unit 180. The input to the X-filter 178 is the $\alpha$ signal data. Therefore, it will be impossible for the X-filter 178 to drive the $\alpha$ signal to zero because the $\alpha$ signal and the $\Omega$ signal are not correlated (i.e. are independent of each other). The input to the X-filter 178 is the $\alpha$ signal data and so the only part of the signal stored in the $\Omega$ register 166 that will be driven to zero by the X-filter 178 is the component of the signal in the $\Omega$ register 166 that is actually part of the $\alpha$ signal. In other words, by attempting to drive the signal in the $\Omega$ register 166 to zero, the X-filter 178 will be trained, so as to remove the portion of the signal in the $\Omega$ register 166 that is caused by the $\alpha$ signal.

The $\Omega$ filter 182 is analogous to the $\alpha$ filter 176 and uses the same stop and go and decision directed algorithm to train up the weight coefficients and then switches to the decision directed algorithm. Note that the $\Omega$ filter 182 is the last filter to be trained since first the $\alpha$ signal must be acquired (and hence the Z-filter 168 and $\alpha$ filter 176 must be trained) and then the X-filter 178 must be trained prior to attempting to acquire the $\Omega$ signal by training up the $\Omega$ filter 184.

The summation unit 174 either adds or subtracts the output of the frequency halver 170. The setting is a function of the direction of propagation of the $\Omega$ signal. However, if the setting is set to the opposite of the direction of propagation of the $\Omega$ signal, then the weights of the Z-filter 168 will simply train up to values that are opposite of the values that the weights would train up to if the switch were set in the other direction. That is, the weights of the Z-filter 168 and the direction of the operation at the summation unit 174 cooperate to ensure that the Ω signal is ultimately subtracted from the line signal at the summation unit 174.

The initial setting could be important if the amplitude of the α signal and the Ω signal were approximately equal. In that case, a user-actuatable switch can be provided so that a user can examine the output of the adaptive filter matrix 126 and manually change the sense of the input to the summation unit 174 by actuating the switch.

It is possible to correlate the elements of the functional diagram 100 of FIG. 22 with the actual hardware and/or software used to implement the invention. The α signal detector 102 corresponds to the combination of the Z-filter 168, the frequency halver 170, the delay 172, the summation unit 174 and the α filter 176. The α signal subtractor 104 corresponds to the X-filter 178 and the summation unit 180. The Ω signal detector 106 of FIG. 22 corresponds to the Ω filter 184.

Although the adaptive filter matrix unit 126 is illustrated herein using specific types of filters that are initialized to specific values and trained up using specific methods and/or sequences, it will be appreciated by one skilled in the art that these filters can be replaced with different types of filters, can be initialized and/or trained in a different manner, can be replaced with non-adaptive filters, and can even be replaced with analog filters. The types of filters employed by the adaptive filter matrix unit 126 can vary based on a variety of functional factors known to one skilled in the art.

While we have shown and described several embodiments in accordance with the present invention, it is to be understood that the same is not limited thereto but is susceptible to numerous changes and modifications as known to a person skilled in the art, and we therefore do not wish to be limited to the details shown and described herein but intend to cover all such changes and modifications as are obvious to one of ordinary skill in the art.

What is claimed is:

1. An apparatus for blind signal separation and equalization of two pulse amplitude modulated (PAM) signals conveyed over a transmission line, said two pulse amplitude modulated signals including a stronger PAM signal designated as an alpha (α) signal and a weaker PAM signal designated as an omega (Ω) signal, comprising:

an α signal detector, coupled to said transmission line and being operative to provide at its output said α signal;

an α signal subtraction unit, coupled to said transmission line and to said output of said α signal detector, and being operative to subtract the effect of said α signal from the signal on the transmission line; and an Ω signal detector, coupled to the output of said α signal subtraction unit, and being operative to provide at its output said Ω signal.

2. An apparatus according to claim 1, wherein said α signal detector comprises:

a first filter, coupled to said transmission line, having an impedance corresponding to the impedance of said transmission line as seen by said Ω signal;

a first summation unit, coupled to said transmission line and to said first filter, and being operative to subtract the output of said first filter from the signal on said transmission line; and a second filter, coupled to the output of said first summation unit and being operative to filter distortion from the output of said first summation unit and provide said α signal.

3. An apparatus according to claim 2, wherein said α signal subtraction unit comprises a third filter, having an input coupled to the output of said second filter, for providing a signal corresponding to the contribution of said α signal.

4. An apparatus according to claim 3, wherein said Ω signal detector comprises a delay unit coupled to said transmission line, a second summation unit coupled to combine outputs of said delay unit and said third filter, and a fourth filter, coupled to the output of said second summation unit, for removing distortion from the output of the second summation unit to provide the Ω signal.

5. An apparatus according to claim 4, wherein said first, second, third and fourth filters are adaptive digital filters.

6. An apparatus for blind signal separation and equalization of two pulse amplitude modulated (PAM) signals comprised of a stronger PAM signal and a weaker PAM signal conveyed over a signal transmission line comprising:

a physical interface unit coupled to said signal transmission line and being operative to sense a transmission line voltage signal and a transmission line current signal;

an analog processing unit having an analog signal conditioner and an A/D conversion unit for converting said line voltage signal and said line current signal into respective digital voltage and digital current signals;

a first filter which approximates the impedance of said transmission line seen by said weaker PAM signal and is coupled to filter said digital current signal;

a first summer, coupled to receive said digital voltage signal and coupled to said first filter, and being operative to provide a signal representative of the difference between said digital voltage signal and the output of said first filter;

a second filter, coupled to the output of said first summer, which is operative to output said stronger PAM signal;

a third filter, coupled to the output of said second filter, for generating a signal representative of the contribution of said stronger PAM signal;

a second summer, which is coupled to receive a signal representative a first order approximation of said weaker PAM signal and to the output of the third filter, and is operative to subtract said signal representative of the contribution of said stronger PAM signal output by said third filter from said first order approximation of said weaker PAM signal; and a fourth filter, coupled to the output of said second summer and being operative to provide said weaker PAM signal.

7. An apparatus according to claim 6, wherein said first, second, third and fourth filters are adaptive digital filters.

8. An apparatus according to claim 7, wherein said, second and fourth filters are decision feedback equalizer filters.

9. A method of blind signal separation and equalization of two pulse amplitude modulated (PAM) signals comprised of a stronger PAM signal and a weaker PAM signal conveyed over a transmission line comprising the steps of:

(a) sensing respective voltage and current signal components of said two PAM signals conveyed over said transmission line;

(b) filtering said current signal component with a filter that approximates a transmission line impedance seen by said weaker PAM signal;

(c) providing a signal representative of the difference between said voltage signal component and the filtered current signal component provided in step (b);

(d) filtering said signal representative of the difference between said voltage signal component and the filtered current signal component provided in step (c) so as to derive a signal corresponding to the contribution of said stronger PAM signal;

(e) providing a first order approximation of said weaker PAM signal; and (f) subtracting said signal corresponding to the contribution of said stronger PAM signal derived in step (d) from the first order approximation of said weaker PAM signal provided in step (e).

10. A method according to claim 9, wherein the filtering steps are performed using adaptive digital filters.

* * * * *

UNITED STATES PATENT AND TRADEMARK OFFICE
CERTIFICATE OF CORRECTION

PATENT NO. : 5,500,879
DATED : March 19, 1996
INVENTOR(S) : Webster et al

It is certified that error appears in the above-identified patent and that said Letters Patent is hereby corrected as shown below:

Cover page, item [73],

Change: "Assignee: Adtran, Huntsville, Ala." to

--Assignee: Harris Corporation, Melbourne, Florida--

Signed and Sealed this

Sixth Day of May, 1997

Attest:

BRUCE LEHMAN

Attesting Officer

Commissioner of Patents and Trademarks